(12) United States Patent
Zhang

(10) Patent No.: US 12,306,487 B2
(45) Date of Patent: May 20, 2025

(54) CONTROL CIRCUIT AND CONTROL METHOD FOR LIQUID CRYSTAL PIXELS

(71) Applicant: Chengdu Jiutian Huaxin Technology Co., Ltd, Sichuan (CN)

(72) Inventor: Jin Zhang, Sichuan (CN)

(73) Assignee: Chengdu Jiutian Huaxin Technology Co., Ltd, Chengdu (CN)

( * ) Notice: Subject to any disclaimer, the term of this patent is extended or adjusted under 35 U.S.C. 154(b) by 53 days.

(21) Appl. No.: 18/226,795

(22) Filed: Jul. 27, 2023

(65) Prior Publication Data

US 2023/0367150 A1  Nov. 16, 2023

Related U.S. Application Data

(63) Continuation of application No. PCT/CN2021/087387, filed on Apr. 15, 2021.

(30) Foreign Application Priority Data

Jan. 28, 2021 (CN) .......................... 202110121466.7
Feb. 9, 2021 (CN) .......................... 202110179350.9

(51) Int. Cl.
*G02F 1/133* (2006.01)
*G02F 1/1343* (2006.01)
(Continued)

(52) U.S. Cl.
CPC ...... *G02F 1/13306* (2013.01); *G02F 1/13439* (2013.01); *G02F 1/136213* (2013.01);
(Continued)

(58) Field of Classification Search
None
See application file for complete search history.

(56) References Cited

U.S. PATENT DOCUMENTS 5,627,557 A * 5/1997 Yamaguchi .......... G09G 3/3659
345/96
6,278,426 B1 * 8/2001 Akiyama ............ G02F 1/13624
345/97

(Continued)

OTHER PUBLICATIONS

International Search Report of PCT Patent Application No. PCT/CN2021/087387 issued on Aug. 26, 2021.

*Primary Examiner* — Lunyi Lao
*Assistant Examiner* — Sarvesh J Nadkarni

(57) ABSTRACT

The present invention discloses a control circuit and a control method for liquid crystal pixels, wherein the control circuit for liquid crystal pixels comprises a preset charging module, a second-order programming module and a first-order programming module which are connected in sequence. The present invention firstly charges the preset charging module, and then programs the preset charging module by the second-order programming module to make a voltage reach a maintenance voltage required by display of an image by a liquid crystal screen; and finally, the first-order programming module stores electric quantity for display of a next frame image when the liquid crystal screen displays a current image under the maintenance voltage, i.e., at the same time that the current image is displayed, the electric quantity required for display of the next frame image is prepared in advance.

5 Claims, 11 Drawing Sheets

(51) Int. Cl.
*G02F 1/1362* (2006.01)
*G09G 3/36* (2006.01)

(52) U.S. Cl.
CPC ......... *G02F 1/136245* (2021.01); *G09G 3/36* (2013.01); *G09G 3/3655* (2013.01); *G09G 3/3696* (2013.01); *G09G 2320/08* (2013.01)

(56) References Cited

U.S. PATENT DOCUMENTS

| | | | |
|---|---|---|---|
| 6,911,964 B2* | 6/2005 | Lee | G09G 3/3648 345/92 |
| 7,079,101 B1* | 7/2006 | Asada | G09G 3/3648 345/87 |
| 2008/0170022 A1* | 7/2008 | Chen | G09G 3/3648 345/92 |
| 2017/0365228 A1* | 12/2017 | Kwok | G09G 3/3685 |
| 2018/0102397 A1* | 4/2018 | Nie | G09G 3/3233 |

* cited by examiner

CONTROL CIRCUIT AND CONTROL METHOD FOR LIQUID CRYSTAL PIXELS

CROSS REFERENCE TO RELATED APPLICATIONS

The present application is a Continuation application of PCT Application No. PCT/CN2021/087387 filed on Apr. 15, 2021, which claims the benefit of Chinese Patent Application Nos. 202110121466.7 filed on Jan. 28, 2021 and 202110179350.9 filed on Feb. 9, 2021. All the above are hereby incorporated by reference in their entirety.

FIELD OF INVENTION

The present invention belongs to the technical field of liquid crystal screen display, and particularly relates to a control circuit and a control method for liquid crystal pixels.

BACKGROUND ART OF THE INVENTION

The display principle of an ordinary liquid crystal screen is: after each row of thin film transistor in a display device of the liquid crystal screen is opened by a gate circuit, a source circuit is responsible for charging, during which a backlight source on a back surface of the liquid crystal screen is responsible for providing light source illumination. Each pixel of the liquid crystal is responsible for the passage of light rays and the amount of the light rays that pass through, so as to form a color image with the cooperation of a color filter; and the characteristics are that the color filter exists and the backlight source is always on.

With the progress of the technology, the liquid crystal display principle of a sequential field has been put forward. Its basic logic is that a monochromatic liquid crystal screen with only gray scale control is used with backlight sources with different colors and color display is achieved through a method of color mixing in time. In general, the RGB three light sources are turned on in sequence without intervals, and an image is divided into sub-screens with three colors of red, green and blue. When a red image is outputted, a red light ray is turned on, and the liquid crystal pixel controls the gray level to allow a certain proportion of red light to pass through. When green is needed, a green light ray is turned on, and the liquid crystal pixel controls the gray level to allow a certain proportion of green light to pass through. The blue is also controlled like this. When the action of the liquid crystal pixel and the action of the backlight source can achieve relatively high switch speed, for example, the liquid crystal pixel can refresh at 180 Hz, and the three-color backlight sources of red, green and blue can also refresh at 180 Hz with coordination, then one color can be controlled in each picture, all the red, green and blue light rays are matched in every three pictures, and every three pictures constitute a frame of color image. For the refresh speed of 180 Hz, the light source under sequential coordination and the refresh of the liquid crystal pixel can achieve a 60 Hz color image.

However, in fact, because it takes a certain action time to turn on and turn off the liquid crystal, a display driver of the liquid crystal is scanned row by row, a liquid crystal pixel charging circuit is opened, and then another circuit charges the liquid crystal pixel. After the charging is completed, the liquid crystal is twisted to allow the light ray to pass through and display the image. Because the image display resolution becomes higher and higher, the scanning time from a first row to a last row is longer and longer and the requirements for a driving circuit are higher and higher. By taking 1080P as an example, 1080 rows of scanning need to be completed in each subframe time, so the time of each row is very short. After all the rows are scanned, the backlight source is turned on. It can be found that when the total display time of each subframe picture is constant, the time for a backlight driver to light the backlight source is shorter in case of higher resolution.

For example, at 180 Hz, the total time of each subframe picture is 5.6 milliseconds. If the time required from the beginning of charging for the first row to the end of charging for the last row is 5.4 milliseconds, it means that human eyes have viewed the first row of the image for 5.4 milliseconds, and then the last row under the image is displayed, so that the image will be torn and mismatched.

If the refresh rate is higher, the problem is more serious, and for products that require field sequence display, the picture backlight of each subfield displays a different color. For example, the backlight sources are lighted in sequence in the order of red, blue and green. If it takes 5.4 milliseconds to charge the first row to the last row, that is, 1080 rows, then after 0.2 millisecond, the first row has begun to display the next picture, that is, blue; however, at the current time point, the last row still retains the data of the red picture, and the data of the blue picture has not been charged; and in this case, the image colors are disordered. To solve this problem, starting with the backlight, the driver of the backlight is separated into regions, and the charging data of the liquid crystal are fully synchronized to display in different times and different regions. The thought to solve the problem will lead to huge design difficulty and cost increase. Or, the time from charging of the first row to charging of the last row will also lead to the cost increase of a driver chip and the design difficulty of the circuit.

DISCLOSURE OF THE INVENTION

To solve the above problems, the present invention provides a control circuit for liquid crystal pixels, which can realize synchronous work of liquid crystal pixels on the premise that the existing liquid crystal pixels scan the input image display content through the coordination of gates and sources, so as to effectively improve the phenomena of color confusion and screen tearing caused by time delay from a first row to a last row.

Another purpose of the present invention is to provide a control method for liquid crystal pixels, which is a method realized based on the above control circuit for liquid crystal pixels.

The present invention adopts the following technical solution:

A control circuit for liquid crystal pixels comprises a preset charging module, a second-order programming module and a first-order programming module which are connected in sequence.

The preset charging module is used for charging a liquid crystal pixel capacitor through a high level, and presetting a liquid crystal pixel to a high level state.

The second-order programming module realizes discharge of the preset charging module according to programming data of the first-order programming module 3, so that a charge of the preset charging module reaches a maintenance voltage required by display of an image by the liquid crystal pixel.

The first-order programming module is configured to receive and store a charge transmitted from an external control unit for display of a next frame image.

Preferably, the preset charging module comprises a liquid crystal pixel capacitor Cls, one end of the liquid crystal pixel capacitor Cls is connected with a reference voltage of a liquid crystal screen, and another end is connected with the second-order programming module.

Preferably, the second-order programming module comprises a dual-gate transistor T4, one end of the liquid crystal pixel capacitor Cls is connected with the reference voltage of the liquid crystal screen, and another end is connected with a drain of the dual-gate transistor T4.

Preferably, the first-order programming module comprises a first transistor T1, a source of the dual-gate transistor T4 is coupled to a first synchronization signal Vst1, one gate of the dual-gate transistor T4 is coupled to a second synchronization signal Vst2, and another gate is coupled to the first transistor T1; a gate of the first transistor T1 is configured to couple to an external gate driver, and a source of the first transistor T1 is configured to couple to an external source driver.

Preferably, the first transistor T1 is a dual-gate transistor.

Preferably, when the first transistor T1 is a dual-gate transistor, two gates of the first transistor T1 are both connected to Vscan.

Preferably, when the first transistor T1 is the dual-gate transistor, one gate of the first transistor T1 is connected to Vscan, and another gate is connected to the first synchronization signal Vst1.

Preferably, when the first transistor T1 is the dual-gate transistor, one gate of the first transistor T1 is connected to Vscan, and another gate is connected to another gate of the dual-gate transistor T4.

Preferably, when the first transistor T1 is the dual-gate transistor, one gate of the first transistor T1 is connected to Vscan, and another gate is connected to one gate of the dual-gate transistor T4.

Preferably, when the first transistor T1 is the dual-gate transistor, one gate of the first transistor T1 is connected to Vscan, and another gate is connected to the liquid crystal pixel capacitor Cls.

Preferably, the preset charging module further comprises a second transistor T2, a gate of the second transistor T2 is configured to couple to an external level Vpre, a drain is configured to couple to an external level VH, and a source is connected with the liquid crystal pixel capacitor Cls through an internal node Vpx.

Preferably, the second-order programming module comprises a storage capacitor Cs and a third transistor T3; a drain of the third transistor T3 is coupled to an upper end of the liquid crystal pixel capacitor Cls and the source of the second transistor T2; a source of the third transistor T3 is coupled to the second synchronization signal Vst2; a gate of the third transistor T3 is coupled to and connected with one end of the storage capacitor Cs through an internal node; and another end of the storage capacitor Cs is connected to the first synchronization signal Vst1.

Preferably, when the first-order programming module comprises the first transistor T1, and the second-order programming module comprises the storage capacitor Cs and the third transistor T3, the gate of the first transistor T1 is connected with the gate driver for driving the entire liquid crystal screen, the source of the first transistor T1 is connected with the source driver for driving the entire liquid crystal screen, and a drain of the first transistor T1 is coupled with the storage capacitor Cs and the third transistor T3 through an internal node Q.

Preferably, each pixel unit is at least connected with one first synchronous signal electrode wire and one second synchronous signal electrode wire; the two electrode wires are global common electrode wires used for controlling all pixels; and a layout mode of the global common electrode wires is: arranged along a transverse gate direction, arranged along a longitudinal source direction or arranged crosswise.

Preferably, adjacent two rows or two columns of the global common electrode wires of the control circuit for liquid crystal pixels can share one global common electrode wire of the same property to reduce occupation of opening area.

A control method for liquid crystal pixels applies the above control circuit for liquid crystal pixels and is implemented specifically according to following steps:
   S1, a preset charging link: charging the liquid crystal pixel capacitor through the high level, and presetting the liquid crystal pixel to the high level state;
   S2, a second-order programming link: carrying out programming through the second-order programming module to realize discharge of the preset charging module, so that the charge of the preset charging module reaches the maintenance voltage required by display of the image by the liquid crystal pixel;
   S3, a first-order programming link: maintaining a charge voltage of the liquid crystal pixel, and simultaneously receiving and storing the charge transmitted from the external control unit through the first-order programming module for display of the next frame image.

Preferably, in the preset charging link of the S1, all liquid crystal pixels forming the liquid crystal screen are preset to the high level at one time and synchronously through the high level.

Preferably, all the liquid crystal pixels forming the liquid crystal screen are preset to the high level at one time and synchronously through the high level, specifically:
   When the second-order programming module only comprises a dual-gate transistor T4, the liquid crystal pixel capacitor is preset to an external high level VH through coordination of a first synchronization signal Vst1 and a second synchronization signal Vst2.

Preferably, all the liquid crystal pixels forming the liquid crystal screen are preset to the high level at one time and synchronously through the high level, specifically:
   When the second-order programming module comprises a storage capacitor Cs and a third transistor T3, the liquid crystal pixel capacitor is preset to the external high level VH through coordination of an external level Vpre and a liquid crystal pixel VH.

Preferably, carrying out programming through the second-order programming module to realize discharge of the preset charging module, so that the charge of the preset charging module reaches the maintenance voltage required by display of the image by the liquid crystal pixel in the S2 is specifically:
   When the second-order programming module only comprises the dual-gate transistor T4, the dual-gate transistor T4 is conducted through coordination of the first synchronization signal Vst1 and the second synchronization signal Vst2 for discharging a liquid crystal pixel capacitor Cls; when the liquid crystal pixel capacitor Cls is discharged, discharge time depends on a time when high and low levels of the first synchronization signal Vst1 and the second synchronization signal Vst2 cooperate with each other, discharge speed depends on the electric quantity stored by the dual-gate transistor T4, and a discharge capacity depends on the charge stored in S3.

Preferably, when the second-order programming module comprises the storage capacitor Cs and the third transistor T3, the third transistor T3 is conducted through coordination of the first synchronization signal Vst1 and the second synchronization signal Vst2 for discharging the liquid crystal pixel capacitor Cls; a conducting capacity and a conducting duration of the third transistor T3 are jointly determined by the charge stored in the storage capacitor Cs in the S3, the first synchronization signal Vst1 and the second synchronization signal Vst2; an electric quantity of the liquid crystal pixel capacitor Cls is released from the high level state to a required electric quantity; and then a voltage of the liquid crystal pixel capacitor Cls is programmed as the maintenance voltage required by display of the image by the liquid crystal pixel.

Preferably, when the liquid crystal pixel capacitor Cls is discharged, discharge time depends on a time when high and low levels of the first synchronization signal Vst1 and the second synchronization signal Vst2 cooperate with each other.

Preferably, when the liquid crystal pixel capacitor Cls is discharged, a discharge capacity depends on the charge stored in S3.

Preferably, in the second-order programming link of the S2, second-order programming of all the pixels forming the liquid crystal screen is completed synchronously and at one time.

Preferably, after the second-order programming link of the S2, a backlight lamp is lighted, and first-order programming is carried out synchronously.

Preferably, after the second-order programming link of the S2, the backlight lamp is lighted, and first-order programming is carried out after buffering, wherein the first-order programming can be extended to the preset charging link of a next frame picture, but cannot be extended to the second-order programming link.

Preferably, in maintaining a charge voltage of the liquid crystal pixel, and simultaneously receiving and storing the charge transmitted from the external control unit through the first-order programming module for display of the next frame image in the S3, when the second-order programming module comprises the storage capacitor Cs, specifically:

S31, a buffer stage: in the buffer stage, by delaying charging time of first-order programming work of the liquid crystal screen from a first row, adjusting a holding time of the storage capacitor Cs in the second-order programming module, and determining an end time of the first-order programming from the first row to a last row;

S32, a first-order programming stage: carrying out charging operation by the liquid crystal screen from the first row to the last row successively, matching a gate driver of the liquid crystal screen with a source driver and carrying out first-order programming charging for each liquid crystal pixel from the first row to the last row, wherein charging data is related to a displayed image and controlled by the source driver.

When the second-order programming module does not comprise the storage capacitor Cs, specifically:

a buffer stage: in the buffer stage, by delaying charging time of first-order programming work of the liquid crystal screen from a first row, adjusting holding times of electric quantity stored by a top gate and a bottom gate of the dual-gate transistor T4 in the second-order programming module, and by delaying charging time of first-order programming work of the liquid crystal screen from a first row, adjusting a holding time of the storage capacitor Cs in the second-order programming module, and determining an end time of the first-order programming from the first row to a last row;

a first-order programming stage: carrying out charging operation by the liquid crystal screen from the first row to the last row successively, matching a gate driver of the liquid crystal screen with a source driver and carrying out first-order programming charging for each liquid crystal pixel from the first row to the last row, wherein charging data is related to a displayed image and controlled by the source driver.

Preferably, the time of the buffer stage in the S31 depends on a fabrication process of the liquid crystal screen, and a maximum time is not greater than a time used by a frame picture;

Preferably, a first-order programming time of all the liquid crystal pixels can be completed in this frame picture, or extended to the S1 stage of the next frame, but cannot be extended to the S2 stage.

Preferably, the method further comprises: backlight sources of the liquid crystal screen are turned on and off successively, and a first-order programming process carried out successively in the first-order programming stage forms a streamlined driving logic.

Preferably, when the first synchronization signal Vst1 and the second synchronization signal Vst2 are square waves, a range of operating voltage Vpx of the liquid crystal pixel Cls is $0 \leq Vpx \leq VH$, wherein VH is a voltage when the liquid crystal pixel capacitor is preset to a highest level.

Preferably, when the first synchronization signal Vst1 and the second synchronization signal Vst2 are oblique wave voltage signals, the dual-gate transistor keeps the liquid crystal pixel capacitor in a high level state for a certain time and then conducts the liquid crystal pixel capacitor, and discharges the liquid crystal pixel capacitor to a zero level.

Preferably, when the operating voltage is a high level, the time for maintaining the high level depends on the charge in the S3 and the parameters of oblique waves.

Compared with the prior art, in use of the present invention, firstly, the liquid crystal pixel capacitor is charged through the high level, and the liquid crystal pixel is preset to a high level state; then the second-order programming module programs the charge to achieve discharge for the preset charging module to make the charge reach a maintenance voltage required by display of an image by the liquid crystal screen; and finally, the charge voltage of the liquid crystal pixel is maintained, and meanwhile, the first-order programming module is configured to receive and store the charge transmitted from the external control unit for display of a next frame image. The liquid crystal pixel unit is preset to a high level at first, and then discharged to a level required by display of the image, which is faster than charging from a low level to a high level.

Secondly, each frame picture is preset to a high level, which eliminates a ghost phenomenon generated by the liquid crystal capacitor under a specific picture. At the same time, when the current image is displayed, the electric quantity required by display of the next frame image is programmed for charging, because programming charging at this time needs successive charging row by row and the time is very long. Through the simultaneous mode of display of the current picture and advance storage of electric quantity data of the next frame picture, requirements for the driving capacities of the external gate driver and the source driver are greatly reduced, the time of the picture display backlight illumination is also greatly extended and the phenomena of color confusion and screen tearing caused by insufficient brightness or overlong backlight source time due to compression of backlight source illumination time because the time from the first row to the last row is very long in a gate scanning drive mode of a liquid crystal display are effectively improved.

DETAILED DESCRIPTION OF THE INVENTION

Figure 1:
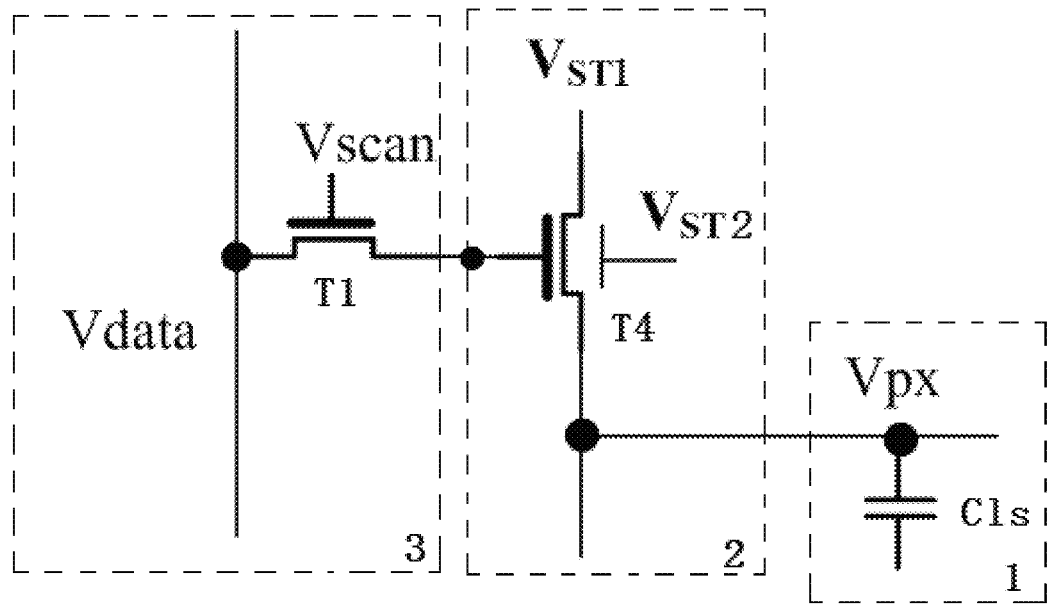
FIG. 1 is a circuit diagram of a control circuit of a liquid crystal pixel provided in embodiment 1 of the present invention.

To make the purpose, the technical solution and the advantages of the present invention more clear, the present invention will be further described below in detail in combination with the drawings and the embodiment. It should be understood that the specific embodiments described herein are only used for explaining the present invention, not used for limiting the present invention.

It should be clear in the description of the present invention that terms such as "perpendicular", "transverse", "longitudinal", "front", "rear", "left", "right", "upper", "lower", "horizontal", etc. indicate direction or position relationships shown based on the drawings, and are only intended to facilitate the description of the present invention rather than to mean that the indicated device or element must have a specific direction or position, and therefore, shall not be understood as a limitation to the present invention.

It should be noted in the description of the present invention that, unless otherwise specifically regulated and defined, terms such as "installation," "connected," and "connecting" shall be understood in broad sense, and for example, may refer to fixed connection or detachable connection or integral connection, may refer to mechanical connection or electrical connection, and may refer to direct connection or indirect connection through an intermediate medium. For those ordinary skilled in the art, the specific meanings of the above terms in the present invention may be understood according to specific conditions.

In the description of the present invention, it should also be noted that bottom gate control and top gate control herein are relative, and the source and the drain are also relative; and those skilled in the art can carry out adjustment according to the conventional means.

In the present invention, the first synchronization signal, the second synchronization signal and the external high level VH signal belong to the global public data of different properties, and the names are relative, which may be different in different habits.

Moreover, in the description of the present invention, for different circuits, the electrodes corresponding to the global voltage are named differently under different driving methods and calculation methods in order to consider the habits of those skilled in the art.

In the description of the present invention, the LTPS technology and the expression habit are adopted, but the method in the present invention is also applicable to liquid crystal screens produced by the technical technologies of different liquid crystal screens such as IGZO, a-Si and OTFT.

On the one hand, the present invention aims to solve the problem under a field sequence color realization method, and on the other hand, the present invention can also be applied to a traditional liquid crystal screen with backlight that is on.

The name of a field sequence drive liquid crystal screen used in the present invention is also known as a sequential method, a color sequence method, etc. in different occasions.

Embodiment 1

Embodiment 1 of the present invention provides a control circuit for liquid crystal pixels, as shown in FIG. 1, which comprises a preset charging module 1, a second-order programming module 2 and a first-order programming module 3 which are connected in sequence.

The preset charging module 1 is used for charging a liquid crystal pixel capacitor through a high level, and presetting a liquid crystal pixel to a high level state.

The second-order programming module 2 realizes discharge of the preset charging module 1 according to programming data of the first-order programming module 3, so that a charge of the preset charging module reaches a maintenance voltage required by display of an image by the liquid crystal pixel.

The first-order programming module 3 is configured to receive and store a charge transmitted from an external control unit for display of a next frame image.

In this way, by the above structure, firstly, the liquid crystal pixel capacitor of the preset charging module 1 is charged through the high level, and the liquid crystal pixel is preset to a high level state. Then the second-order programming module 2 programs the charge to achieve discharge for the preset charging module to make the charge reach the maintenance voltage required by display of the image by the liquid crystal pixel; and finally, in the process of displaying the image by the liquid crystal pixel, the first-order programming module 3 is configured to receive and store a charge transmitted from an external control unit for display of a next frame image. That is, at the same time that the current image is displayed, the electric quantity required for display of the next frame image is prepared in advance. The joint mode of display and advance storage saves time, and effectively improves the phenomena of color confusion and screen tearing caused by time delay from a first row to a last row in a gate scanning drive mode of a liquid crystal display.

In specific embodiments:

The preset charging module 1 comprises a liquid crystal pixel capacitor Cls, one end of the liquid crystal pixel capacitor Cls is connected with a reference voltage of a liquid crystal screen, and another end is connected with the second-order programming module 2.

In this way, the liquid crystal pixel capacitor Cls can be directly charged through an external sequential control circuit VH.

In one embodiment:

The second-order programming module 2 comprises a dual-gate transistor T4, one end of the liquid crystal pixel capacitor Cls is connected with the reference voltage of the liquid crystal screen, and another end is connected with a drain of the dual-gate transistor T4.

The first-order programming module 1 comprises a first transistor T1, a source of the dual-gate transistor T4 is coupled to a first synchronization signal Vst1, one gate of the dual-gate transistor T4 is coupled to a second synchronization signal Vst2, and another gate is coupled to the first transistor T1; a gate of the first transistor T1 is configured to couple to an external gate driver, and a source of the first transistor T1 is configured to couple to an external source driver.

In this way, by the above structure, firstly, the liquid crystal pixel capacitor Cls is charged through the high level, and the liquid crystal pixel is preset to a high level state. Then the dual-gate transistor T4 is conducted, and the charge is programmed to achieve discharge to make the charge reach an operating voltage required by display of an image by the liquid crystal pixel; and finally, while the charge voltage of the liquid crystal pixel is maintained, the first transistor T1 is configured to receive and store the charge transmitted from the external control unit for display of a next frame image. This mode effectively improves the phenomena of color confusion and screen tearing caused by insufficient brightness due to compression of backlight source illumination time because the time from the first row to the last row is very long in a gate scanning drive mode of a liquid crystal display, or caused by overlong non-frame brightness because the backlight source is turned on when the liquid crystal pixel is not charged to the frame data.

More importantly: the present embodiment only needs two transistors (the first transistor T1 and the dual-gate transistor T4) and one capacitor (the liquid crystal pixel capacitor Cls) to realize the above functions, with controllable volume, controllable technology and controllable cost, and because of small volume, an aperture ratio and light transmittance are high, the backlight illumination time is long and good application value is realized.

In specific embodiments:

the first transistor T1 is a dual-gate transistor.

Figure 2A:
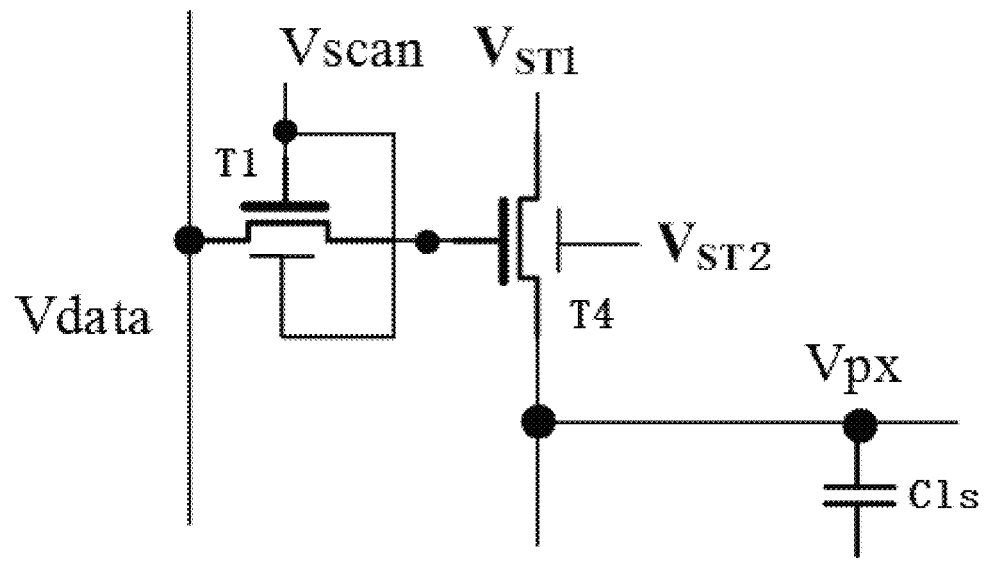
FIG. 2a is a diagram of a first connection mode of a first transistor T1 when the first transistor T1 is a dual-gate transistor in a control circuit for liquid crystal pixels provided in embodiment 1 of the present invention.
Figure 2B:
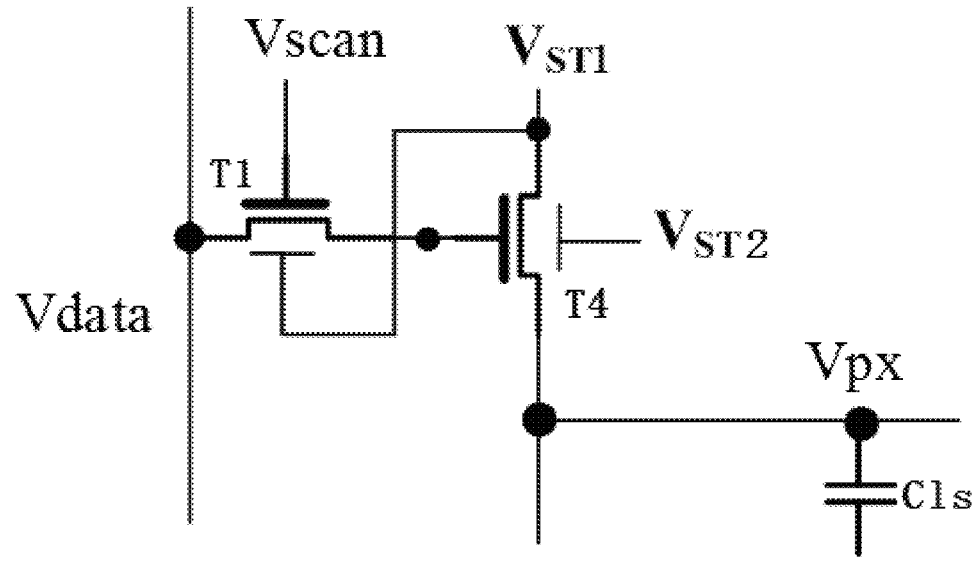
FIG. 2b is a diagram of a second connection mode of a first transistor T1 when the first transistor T1 is a dual-gate transistor in a control circuit for liquid crystal pixels provided in embodiment 1 of the present invention.
Figure 2C:
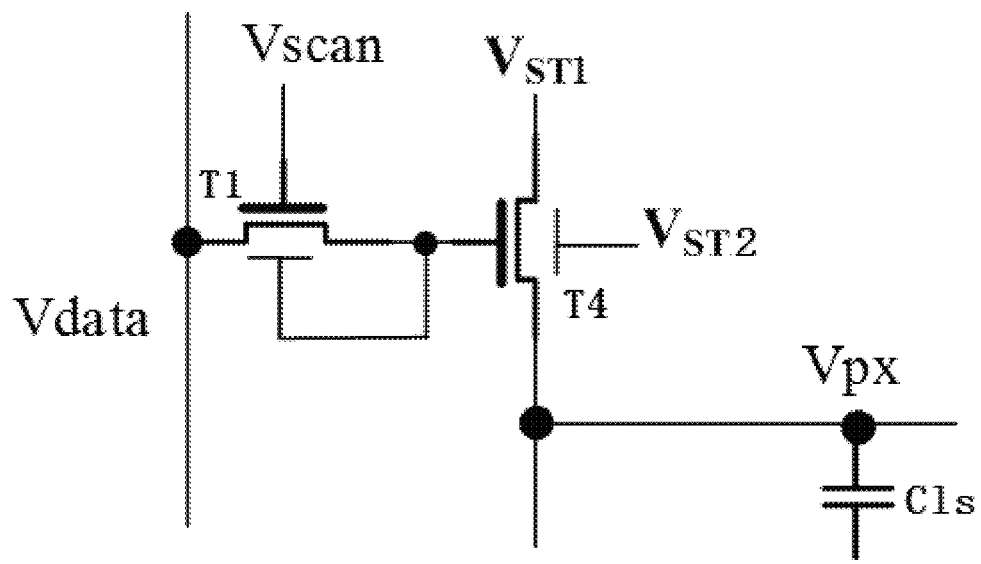
FIG. 2c is a diagram of a third connection mode of a first transistor T1 when the first transistor T1 is a dual-gate transistor in a control circuit for liquid crystal pixels provided in embodiment 1 of the present invention.
Figure 2D:
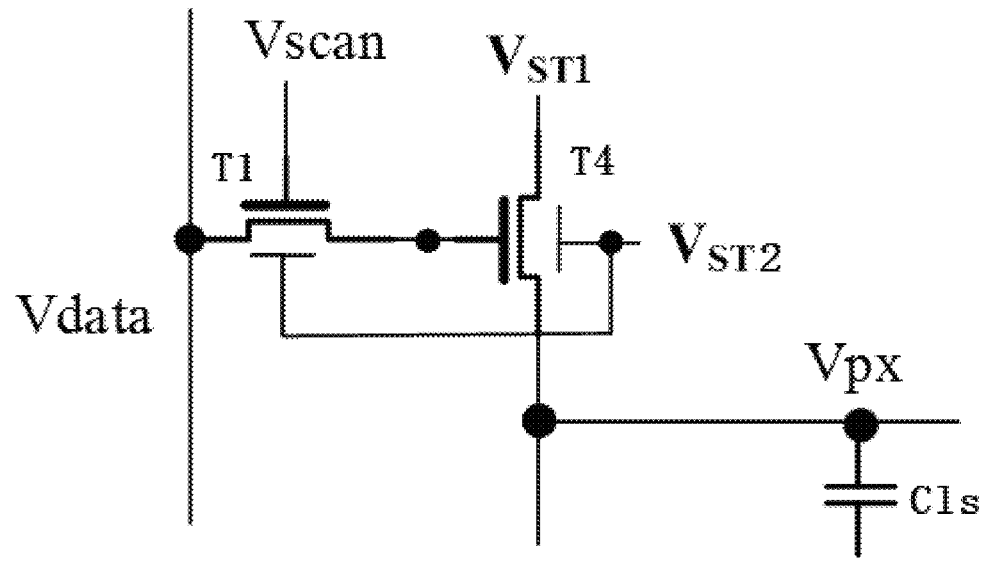
FIG. 2d is a diagram of a fourth connection mode of a first transistor T1 when the first transistor T1 is a dual-gate transistor in a control circuit for liquid crystal pixels provided in embodiment 1 of the present invention.
Figure 2E:
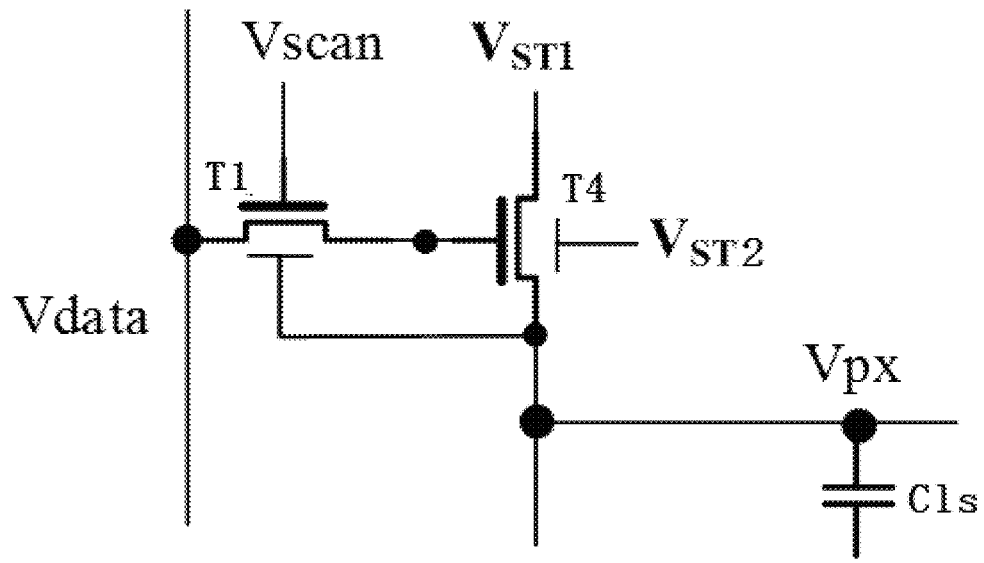
FIG. 2e is a diagram of a fifth connection mode of a first transistor T1 when the first transistor T1 is a dual-gate transistor in a control circuit for liquid crystal pixels provided in embodiment 1 of the present invention.

To have a better opening effect, when the first transistor T1 is a dual-gate transistor, the transistor T1 has the following five connection modes:

First: when the first transistor T1 is a dual-gate transistor, two gates of the first transistor T1 are both connected to Vscan, as shown in FIG. 2a;

Second: when the first transistor T1 is the dual-gate transistor, one gate of the first transistor T1 is connected to Vscan, and another gate is connected to the first synchronization signal Vst1, as shown in FIG. 2b;

Third: when the first transistor T1 is the dual-gate transistor, one gate of the first transistor T1 is connected to Vscan, and another gate is connected to another gate of the dual-gate transistor T4, as shown in FIG. 2c;

Fourth: when the transistor T1 is the dual-gate transistor, one gate of the first transistor T1 is connected to Vscan, and another gate is connected to one gate of the dual-gate transistor T4, as shown in FIG. 2d;

Fifth: when the first transistor T1 is the dual-gate transistor, one gate of the first transistor T1 is connected to Vscan, and another gate is connected to the liquid crystal pixel capacitor Cls, as shown in FIG. 2e.

In the above five connection modes, the third is preferred and this connection mode has an effect of enhancing feedback, specifically:

When a Vdata signal of high voltage needs to be transmitted, an auxiliary gate potential is also a high level voltage, which reduces the Vth value of the first transistor T1 and increases programming speed.

When a Vdata signal of low potential is transmitted, an auxiliary gate potential is a low level voltage, which makes the Vth value of the first transistor T1 high, so that the voltage programmed into a gate node of the dual-gate transistor T4 is better maintained.

Wherein Vscan is a gate drive voltage generated by an external gate driver, Vdata is a source drive voltage generated by an external source driver, and Vth is a threshold voltage of the first transistor T1.

Figure 3A:
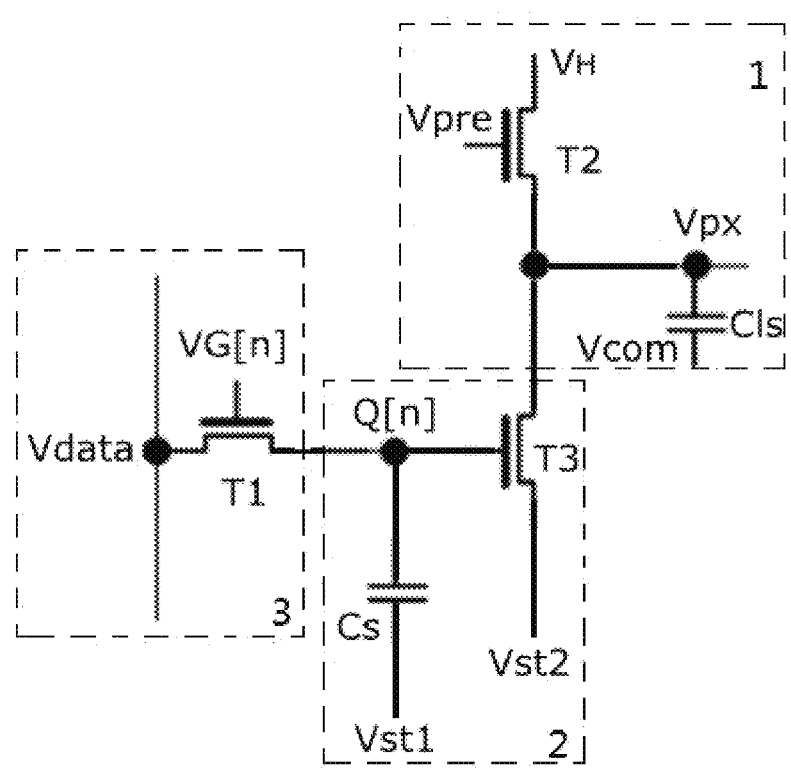
FIG. 3a is another circuit diagram of a control circuit of a liquid crystal pixel provided in embodiment 1 of the present invention.
Figure 3B:
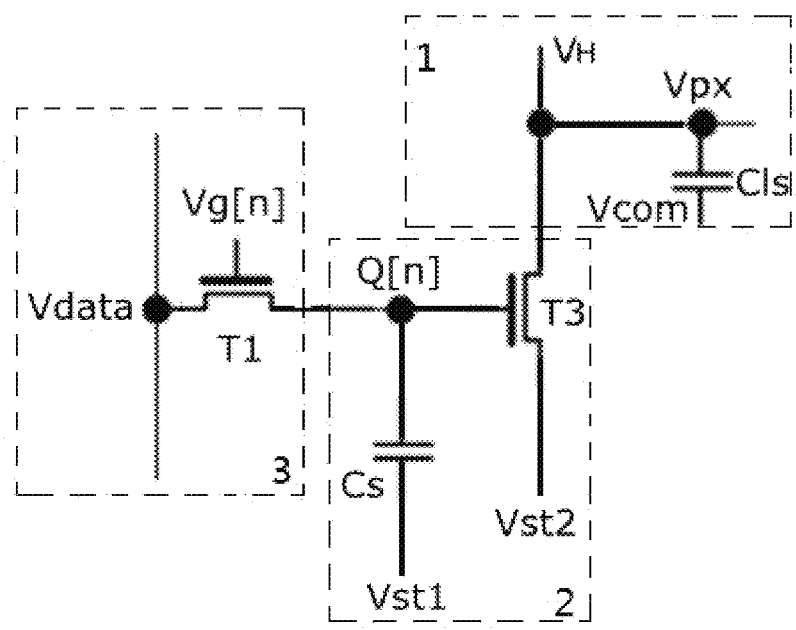
FIG. 3b is a circuit diagram when a liquid crystal pixel capacitor is charged by an external sequential control circuit in a control circuit for liquid crystal pixels provided in embodiment 1 of the present invention.

In another embodiment:

As shown in FIG. 3b, the preset charging module 1 not only comprises the liquid crystal pixel capacitor Cls, but also further comprises a second transistor T2; a gate of the second transistor T2 is configured to couple to an external level Vpre, a drain is configured to couple to an external level VH, and a source is connected with the liquid crystal pixel capacitor Cls through an internal node Vpx.

In the embodiment:

The second-order programming module 2 has two structures:

First: as shown in FIG. 3a, the second-order programming module 2 comprises a storage capacitor Cs and a third transistor T3; a drain of the third transistor T3 is coupled to an upper end of the liquid crystal pixel capacitor Cls and the source of the second transistor T2; a source of the third transistor T3 is coupled to the second synchronization signal Vst2; a gate of the third transistor T3 is coupled to and connected with one end of the storage capacitor Cs through an internal node; and another end of the storage capacitor Cs is connected to the first synchronization signal Vst1.

Figure 3C:
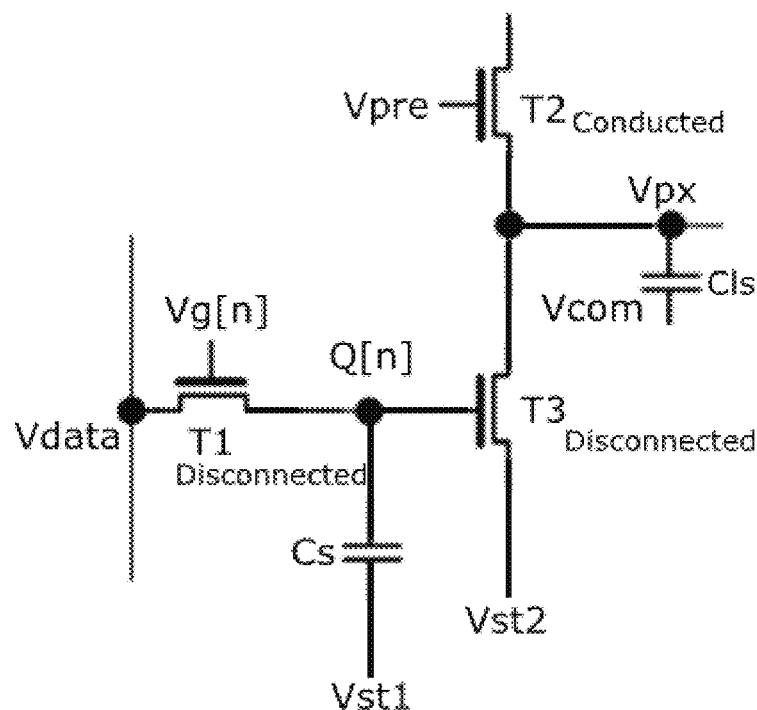
FIG. 3c is a circuit diagram when a preset charging module is in a charging stage in a control circuit for liquid crystal pixels provided in embodiment 1 of the present invention.

In this way, in a preset charging link, the external level Vpre is set as a high level voltage, the first synchronization signal Vst1 is set as a low level voltage, the second synchronization signal Vst2 is set as a high level voltage, and a gate data signal Vg[n] of the first transistor T1 is set as a low level voltage. Therefore, the second transistor T2 is conducted, and the first transistor T1 and the third transistor T3 are both in a disconnected state, as shown in FIG. 3c. The liquid crystal pixel capacitors Cls in all pixel arrays are synchronously pulled to the high level voltage VH to realize the charging of the preset charging module 1.

Moreover, when the preset charging module 1 is operated, the internal node Vpx is at a high level. After secondary programming by the second-order programming module 2, the internal node Vpx is the maintenance voltage required by display of the image by the liquid crystal pixel.

Figure 3D:
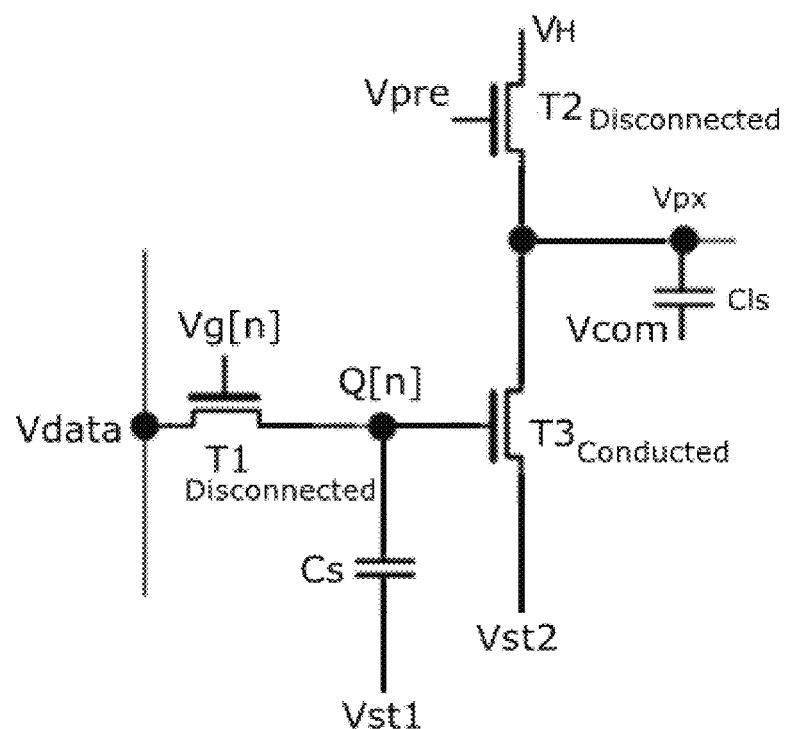
FIG. 3d is a circuit diagram when a second-order programming module is in a programming stage in a control circuit for liquid crystal pixels provided in embodiment 1 of the present invention.

In a second-order programming link, the first synchronization signal Vst1 is set as a high level voltage, the second synchronization signal Vst2 is set as a low level voltage, Vpre is set as a low level voltage and a gate data signal Vg[n] is set as a low level voltage. Therefore, the first transistor T1 and the second transistor T2 are disconnected, and the third transistor T3 is conducted, as shown in FIG. 3d. The conducted third transistor T3 discharges the liquid crystal pixel capacitor Cls.

Figure 3E:
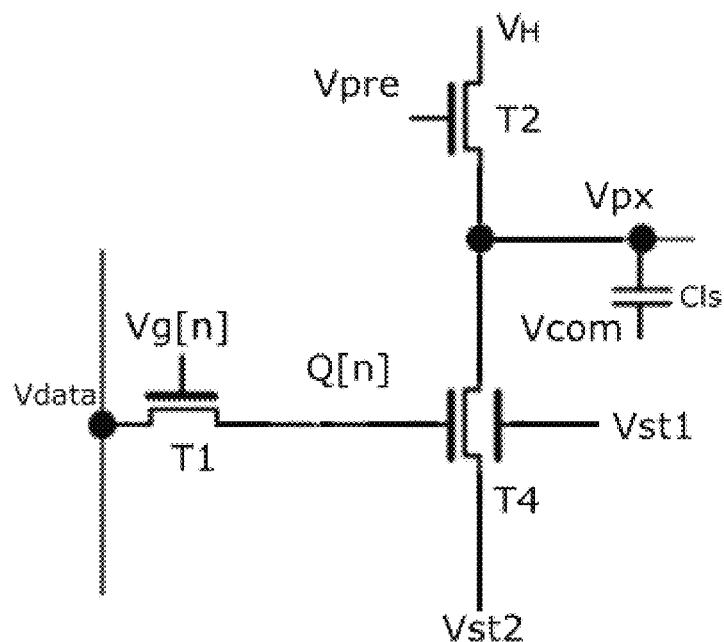
FIG. 3e is a circuit diagram when a second-order programming module is a dual-gate structure in a control circuit for liquid crystal pixels provided in embodiment 1 of the present invention.

Second: the second-order programming module 2 of this structure comprises a dual-gate transistor T4 (the same as the previous embodiment), as shown in FIG. 3e; a drain of the dual-gate transistor T4 is connected in parallel with the upper end of the liquid crystal pixel capacitor Cls and the source of the second transistor T2 through the internal node Vpx; the source of the dual-gate transistor T4 is coupled with the second synchronization signal Vst2; one gate of the dual-gate transistor T4 is connected to the first synchronization signal Vst1, and another gate is coupled to the first-order programming module 3 through an internal node Q.

The second-order programming module 2 of this structure adopts a method of a dual-gate logic for reducing one capacitor Cs, which has the optimization design of saving circuit area and improving the aperture ratio, as the preferred design of the present invention.

Moreover, after one capacitor is reduced in arrangement of the dual-gate transistor, a shading area is significantly reduced. This is a significant change for the inside of the liquid crystal pixel.

Figure 4:
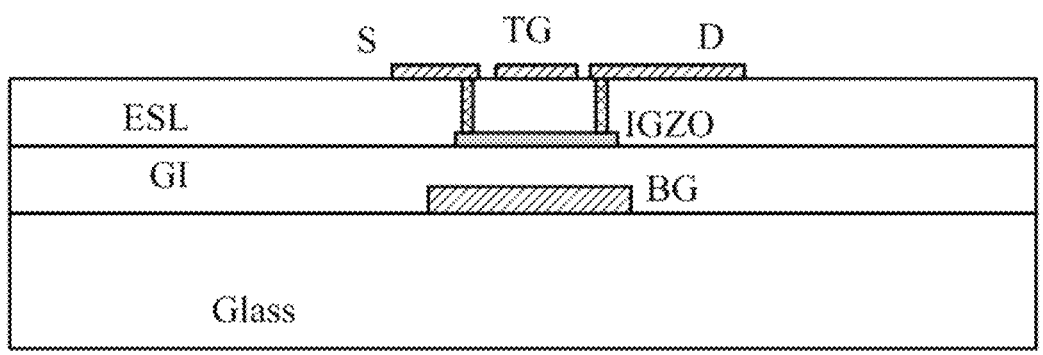
FIG. 4 is a schematic diagram of internal design of an IGZO liquid crystal screen when a second-order programming module adopts a dual-gate design logic in a control circuit for liquid crystal pixels provided in embodiment 1 of the present invention.

The design logic of the dual-gate transistor T4 is adopted, and the internal design schematic diagram of the liquid crystal pixel is shown in FIG. 4. For convenience, an IGZO liquid crystal screen is used as an example for illustration in this example.

Wherein the meanings of parameters in FIG. 4 are:

ESL is an SiOx dielectric protective layer; TG is a signal wire of a top gate, i.e., the top gate of the transistor; BG is a signal wire of a bottom gate, i.e., the bottom gate of the transistor; IGZO is an IGZO layer of the liquid crystal screen; GLASS is a glass substrate layer of the liquid crystal screen; S is a transistor source; and D is a transistor drain.

A common structure in IGZO TFT pixel design is a back channel protection type (ESL type) which is described as an example. In this structure, an IGZO active layer is controlled by a bottom gate insulating layer to form a first gate control, that is, bottom gate control. Since the IGZO active layer is protected by the SiOx dielectric layer (ESL layer) on the back, a top gate control structure can be designed to form a second gate control structure with the IGZO active layer, that is, top gate control. Wherein for ESL devices, a top gate control structure can be comprised of a source-drain metal layer, an ESL layer and an IGZO layer.

When the voltage of the top gate control is different, a dual threshold voltage mode can be formed, which can form an LCD pixel circuit under a two-order programming charging logic.

Further, the top gate control structure can also be comprised of a top ITO metal layer, an ESL layer and an IGZO layer.

In the process of first-order programming charging and second-order programming charging, transformation from a first-order programming state completed in a previous sequence to a second-order programming state of a current sequence depends on a top gate control voltage change in the dual-gate transistor T4, that is, voltage transformation of the connected first synchronization signal Vst1.

In the first-order programming charging state, the first synchronization signal Vst1 is in a low voltage level state, so a threshold voltage of the dual-gate transistor T4 is larger, and the third transistor T3 is not conducted, to maintain the display data of a previous frame.

When entering the second-order programming charging state, the first synchronization signal Vst1 is high, so that a threshold voltage of the dual-gate transistor T4 is smaller; the third transistor T3 enters a conducted state to carry out the second-order programming mode; and the upper voltage Vpx of the liquid crystal pixel capacitor Cls is updated to a final required voltage state.

Figure 5:
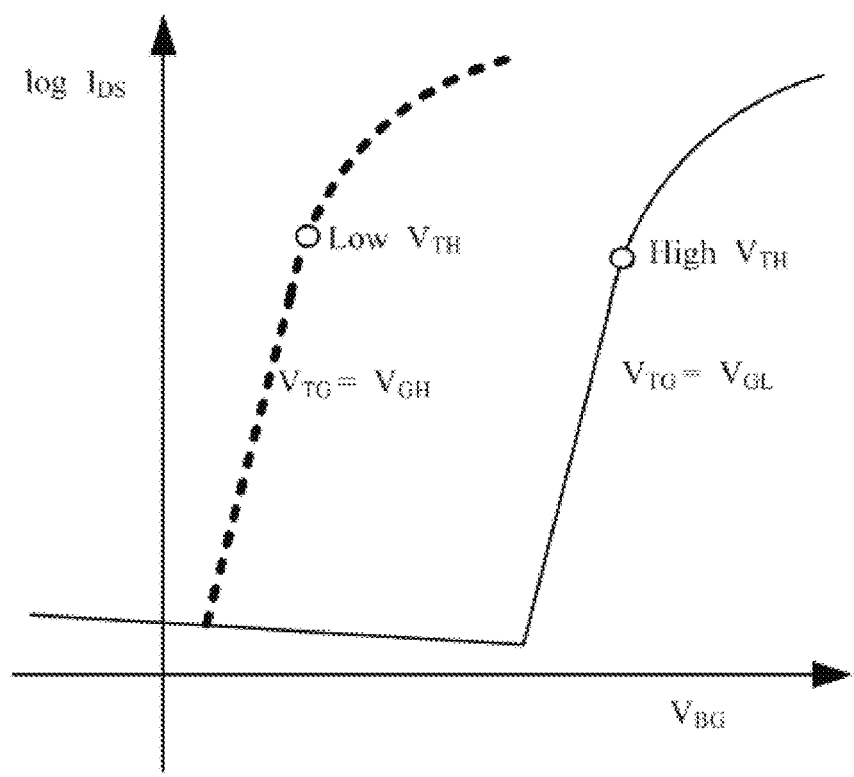
FIG. 5 is a mode diagram of dual-threshold voltage of a dual-gate transistor in a control circuit for liquid crystal pixels provided in embodiment 1 of the present invention.

Further, due to the device conduction performance of the dual-gate transistor T4, multiple operating modes can be switched under the effect of the top gate control. When the voltage of the top gate control is lower, the dual-gate transistor is operated in a high threshold voltage mode; and when the voltage of the top gate control is higher, the dual-gate transistor is operated in a low threshold voltage mode, as shown in FIG. 5.

Wherein the meanings of parameters in FIG. 5 are:

$V_{TG}$ is the voltage of the top gate; $V_{GH}$ is a high voltage set externally; $V_{GL}$ is a low voltage set externally; High $V_{TH}$ is a threshold voltage at a high voltage; Low $V_{TH}$ is a threshold voltage at a low voltage; Log $I_{DS}$ is a logarithmic value of drain and source currents; $V_{BG}$ is a voltage of the bottom gate-the source.

In addition, when one gate is top gate control/bottom gate control, another gate is bottom gate control/top gate control.

Under a specific working logic, a conducting stage of the dual-gate transistor T4, from a Vpx end to a Vst2 end, is an equivalent circuit of a linear resistor. Therefore, the conducting capability and the conducting time of the entire circuit are determined jointly by the charge quantity stored by the dual-gate transistor T4, Vst1 and Vst2. Thus, the charge of the pixel capacitor Cls can be discharged to an appropriate voltage to achieve a goal of final display.

In specific embodiments:

The first-order programming module 3 comprises the first transistor T1, the gate of the first transistor T1 is connected with the gate driver for driving the entire liquid crystal screen, the source of the first transistor T1 is connected with the source driver for driving the entire liquid crystal screen, and a drain of the first transistor T1 is coupled with the storage capacitor Cs and the third transistor T3 through an internal node Q.

Figure 6:
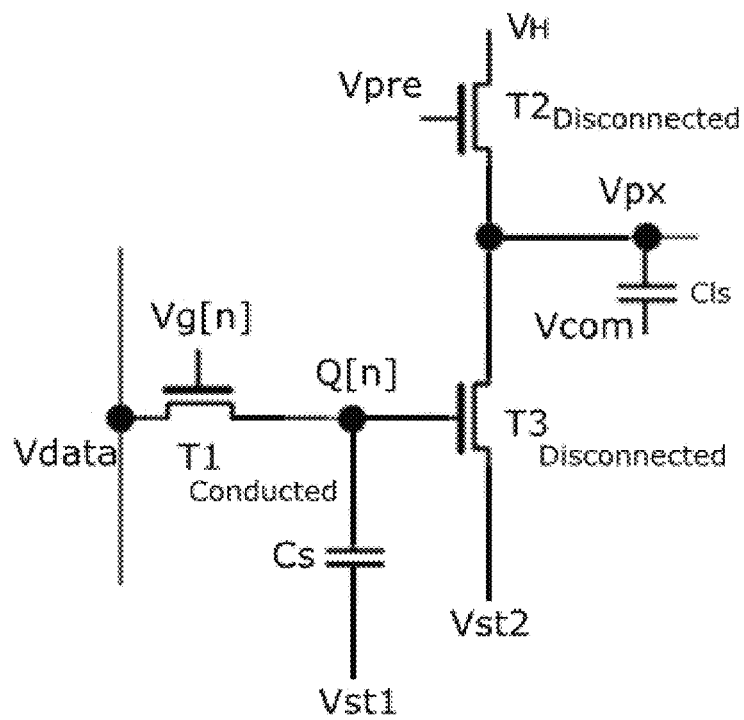
FIG. 6 is a circuit diagram when a first-order programming module is in a programming stage in a control circuit for liquid crystal pixels provided in embodiment 1 of the present invention.

In this way, the first synchronization signal Vst1 is set as a low level voltage, the second synchronization signal Vst2 is set as a high level voltage, Vpre is set as a low level voltage and then the second transistor T2 and the third transistor T3 are both in a disconnected state, as shown in FIG. 6.

Further, a source data signal Vdata is in a high level voltage state, and a gate data signal Vg[n] is in a high level voltage state. At this time, it enters the first-order programming state. That is, according to a basic principle of the liquid crystal, a plurality of rows of the first transistor T1 are successively scanned by a gate circuit Vg[n] and turned on; the storage capacitor Cs is in a state of receiving an external charge; a source data circuit of the liquid crystal is charged and operated, that is, the programming work; and then the storage capacitor Cs will obtain an appropriate electric charge state from Vdata for display of a next cycle.

In addition, it should be noted that the first synchronization signal Vst1, the second synchronization signal Vst2, Vpre and VH in the present embodiment all act on all pixels of the entire liquid crystal screen, and the size properties of these global data signals are the same for any pixel unit of the entire liquid crystal screen.

In specific embodiments:

The pixel circuit further comprises at least two global common electrode wires used for controlling all the pixels. A layout mode of the global common electrode wires is: arranged along a transverse gate direction, arranged along a longitudinal source direction or arranged crosswise.

When the pixel circuit carries out the arrangement of the above global common electrode wires, two adjacent rows or two columns of the global common electrode wires between the liquid crystal pixels can be shared so as to reduce the arrangement of one wire to increase the aperture ratio of the liquid crystal screen.

Specifically, when there are two global common electrode wires which are Vst1 and Vst2, because of a global circuit, two adjacent rows of scanning lines or two adjacent columns of data lines can share this circuit, so as to reduce spatial occupation, thereby increasing the aperture ratio.

That is, in the specific circuit design and the design process of the liquid crystal pixels, in order to reduce spatial occupation, to reduce the resistance and capacitance loads of the entire circuit design and improve the transmission capability, a logic of sharing two adjacent rows of electrode wires is adopted.

In this way, each liquid crystal pixel that applies the circuit is connected with a plurality of global common electrode wires. The electrode wires are arranged in parallel or crosswise by rows or columns in the liquid crystal screen, and adjacent upper and lower rows or left and right columns of liquid crystal pixels can share one identical common electrode wire, so that a set of electrode wires is reduced in a manner that every two rows or every two columns can save one common electrode wire, so as to reduce the area occupied by wiring to increase the aperture ratio of the liquid crystal screen.

Figure 7A:
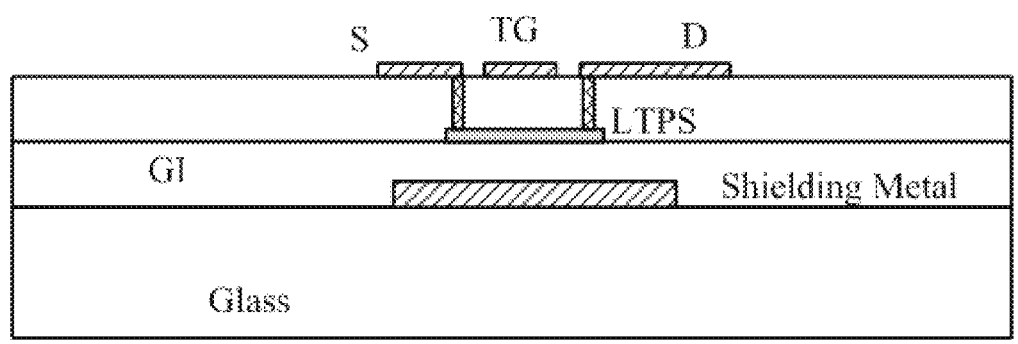
FIG. 7a is a schematic diagram of internal design of an IGZO liquid crystal screen when a second-order programming module adopts a dual-gate design logic in a control circuit for liquid crystal pixels provided in embodiment 1 of the present invention.

More specifically, a structural sectional view of a liquid crystal pixel unit comprising the dual-gate transistor T4 is shown in FIG. 7a, wherein Glass is a glass substrate layer of the liquid crystal screen; S is a transistor source; and D is a transistor drain. TG is a signal wire of a top gate, i.e., the top gate of the transistor; SHIELDING METAL as a protective layer is defined as a bottom gate; and LTPS represents a semiconductor layer under an LTPS technology.

An LTPS active layer is controlled by a bottom gate insulating layer to form a first gate control, that is, bottom gate control. Since the LTPS active layer is protected by the SiOx dielectric layer on the back, a top gate control structure can be designed to form a second gate control structure with the LTPS active layer, that is, top gate control. When the voltage of the top gate control is different, a dual threshold voltage mode can be formed, which can form an LCD pixel circuit under a two-order programming charging logic.

Figure 7B:
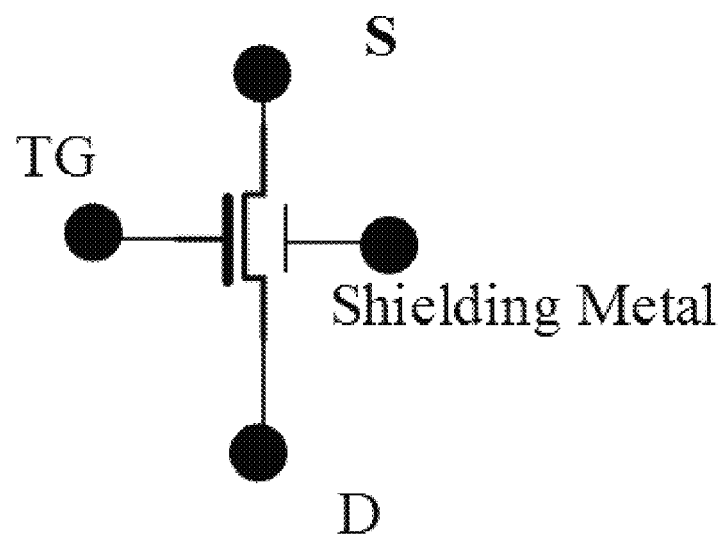
FIG. 7b is an expression schematic diagram of a dual-gate transistor T4 in a control circuit for liquid crystal pixels provided in embodiment 1 of the present invention.

More specifically, a symbolic schematic diagram of the dual-gate transistor T4 is shown in FIG. 7b, wherein S is a transistor source; and D is a transistor drain. TG and Shielding Metal represent two gates respectively.

The present embodiment has the following beneficial effects:

Firstly, all the liquid crystal pixels of the liquid crystal screen can be synchronously displayed normally.

Secondly, through the design of the dual-gate transistor, the internal design of the liquid crystal pixels is significantly changed, the opaque area occupied by the capacitor is saved, the aperture ratio is improved, and the improvement of brightness is facilitated.

Moreover, in the present embodiment, through the coordination of a gate circuit and a source circuit in a normal display stage, the data used in display is programmed, and a drive mode of the liquid crystal screen gate scanning can be adopted in the traditional way, because of the advantages of long time in the scanning drive mode from the first row to the last row and low requirements for the driving capability.

In addition, by setting a black field for a certain time in each frame picture and alternating with a light field lit by the backlight, a streaking phenomenon is improved and picture quality is improved.

Through a specific buffer design logic, for the liquid crystal screen of a different fabrication process, due to differences of a TFT process, a current leakage capacity is different. The buffer design logic better reduces conditions that part of programming data is inaccurate and the display is inaccurate due to excessive capacitor voltage drop caused by current leakage.

Moreover, a more preferred embodiment only needs two transistors and one capacitor to realize the above functions, with controllable volume, controllable technology and controllable cost, and because of small volume, the aperture ratio and light transmittance are high and good application value is realized.

Embodiment 2

Figure 8:
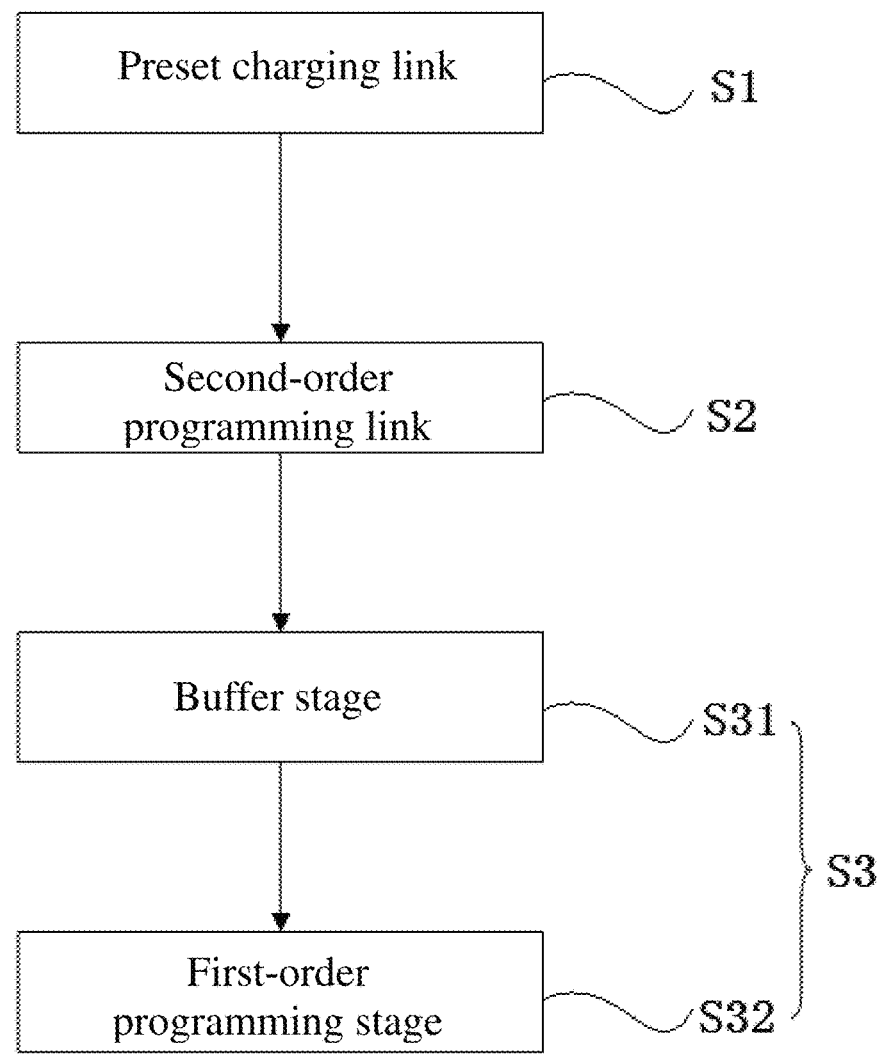
FIG. 8 is a flow chart of a control method for liquid crystal pixels provided in embodiment 2 of the present invention.

Embodiment 2 of the present invention provides a control method for liquid crystal pixels, which applies the control circuit for liquid crystal pixels in embodiment 1, and as shown in FIG. 8, is implemented specifically according to following steps:

S1, a preset charging link: charging the liquid crystal pixel capacitor through the high level, and presetting the liquid crystal pixel to the high level state; specifically: inputting a high level through the global common electrode wires for presetting all liquid crystal pixel capacitors Cls that form the liquid crystal screen to a high level state at one time and synchronously;

S2, a second-order programming link: carrying out programming through the second-order programming module to realize discharge of the preset charging module, so that the charge of the preset charging module reaches the maintenance voltage required by display of the image by the liquid crystal pixel; specifically:

conducting the dual-gate transistor T4 through coordination of the first synchronization signal Vst1 and the second synchronization signal Vst2 for discharging a liquid crystal pixel capacitor Cls;

It should be noted that: because the first synchronization signal Vst1 and the second synchronization signal Vst2 are global voltages shared by the entire liquid crystal screen, the second-order programming link of all the pixels that form the liquid crystal screen is completed synchronously and at one time.

Moreover, when the liquid crystal pixel capacitor Cls is discharged, discharge time depends on a time when high and low levels of the first synchronization signal Vst1 and the second synchronization signal Vst2 cooperate with each other. A discharge capacity depends on the charge stored in S3.

S3, a first-order programming link: maintaining a charge voltage of the liquid crystal pixel, and simultaneously receiving and storing the charge transmitted from the external control unit through the first-order programming module for display of the next frame image; specifically:

carrying out charging operation by the entire liquid crystal screen from the first row to the last row successively, matching a gate driver of the liquid crystal screen with a source driver and carrying out first-order programming charging for each liquid crystal pixel from the first row to the last row.

Wherein charging data is related to a displayed image and controlled by the source driver.

The liquid crystal pixels are turned on row by row successively and controlled by the gate driver.

More specifically:

In the S1:

When the second-order programming module 2 only comprises a dual-gate transistor T4, the liquid crystal pixel capacitor is preset to an external high level VH through coordination of a first synchronization signal Vst1 and a second synchronization signal Vst2.

When the second-order programming module 2 comprises a storage capacitor Cs and a third transistor T3, the liquid crystal pixel capacitor is preset to the external high level VH through coordination of an external level Vpre and a liquid crystal pixel VH.

More specifically:

In the S2:

When the second-order programming module 2 only comprises the dual-gate transistor T4, the dual-gate transistor T4 is conducted through coordination of the first synchronization signal Vst1 and the second synchronization signal Vst2 for discharging a liquid crystal pixel capacitor Cls; and when the liquid crystal pixel capacitor Cls is discharged, discharge time depends on a time when high and low levels of the first synchronization signal Vst1 and the second synchronization signal Vst2 cooperate with each other.

When the second-order programming module 2 comprises the storage capacitor Cs and the third transistor T3, the third transistor T3 is conducted through coordination of the first synchronization signal Vst1 and the second synchronization signal Vst2 for discharging the liquid crystal pixel capacitor Cls; a conducting capacity and a conducting duration of the third transistor T3 are jointly determined by the charge stored in the storage capacitor Cs in the S3, the first synchronization signal Vst1 and the second synchronization signal Vst2; an electric quantity of the liquid crystal pixel capacitor Cls is released from the high level state to a required electric quantity; and then a voltage of the liquid crystal pixel capacitor Cls is programmed as the maintenance voltage required by display of the image by the liquid crystal pixel.

The second-order programming link in the S2 has two forms which are voltage bootstrap digital programming and analog programming respectively.

In the analog programming method, when the first synchronization signal Vst1 and the second synchronization signal Vst2 are square waves, a range of operating voltage Vpx of the liquid crystal pixel Cls is $0 \leq V_{px} \leq VH$, wherein VH is a voltage when the liquid crystal pixel capacitor is preset to a highest level.

In the digital programming method, when the first synchronization signal Vst1 and the second synchronization signal Vst2 are oblique wave voltage signals, the operating voltage is a high level, but the time for maintaining the high level is determined by programming parameters, depending on the charge in the S3 and the parameters of oblique waves.

In addition, the first-order programming link of the S3 is specifically:

When the second-order programming module comprises the storage capacitor Cs, specifically:

S31, a buffer stage: in the buffer stage, by delaying charging time of first-order programming work of the liquid crystal screen from a first row, adjusting a holding time of the storage capacitor Cs in the second-order programming module, and determining an end time of the first-order programming from the first row to a last row;

S32, a first-order programming stage: carrying out charging operation by the entire liquid crystal screen from the first row to the last row successively, mutually matching a gate driver of the liquid crystal screen with a source driver and carrying out first-order programming charging for each liquid crystal pixel from the first row to the last row.

Wherein charging data is related to a displayed image and controlled by the source driver.

When the second-order programming module does not comprise the storage capacitor Cs, specifically:

a buffer stage: in the buffer stage, by delaying charging time of first-order programming work of the liquid crystal screen from a first row, adjusting holding times of electric quantity stored by a top gate and a bottom gate of the dual-gate transistor T4 in the second-order programming module, and by delaying charging time of first-order programming work of the liquid crystal screen from a first row, adjusting a holding time of the storage capacitor Cs in the second-order programming module, and determining an end time of the first-order programming from the first row to a last row;

a first-order programming stage: carrying out charging operation by the liquid crystal screen from the first row to the last row successively, matching a gate driver of the liquid crystal screen with a source driver and carrying out first-order programming charging for each liquid crystal pixel from the first row to the last row, wherein charging data is related to a displayed image and controlled by the source driver.

More specifically:

The time of the buffer stage in the S31 depends on a fabrication process of the liquid crystal screen, and a maximum time is not greater than a time used by a frame picture.

In the S3, a display control system passes through the gate driver, that is, Vg[n] is set to a high level, that is, the gate data line of each row can be driven to control the turn-on of the first transistor T1; and the source driver transmits a voltage signal Vdata used to display the image through the first transistor T1 to the storage capacitor Cs.

The first-order programming module is configured to receive and store a charge transmitted from an external control unit for display of a next frame image in the S3. Because the liquid crystal screen has many rows of liquid crystal pixel units, it takes a long time to program from the first row until the end. In the present embodiment, the first-order programming process can be continued to the preset charging link, i.e., the S1 process, of a next frame picture.

More specifically:

In the buffer stage of the S31, the backlight source has been turned on, and the liquid crystal pixel capacitor Cls in this stage maintains the maintenance voltage obtained after discharge during the discharge stage of the previous stage. After the backlight source is driven, the liquid crystal display can display a correct image.

The buffer stage is used for a buffer period and a preparation period in a drive process. Considering an actual situation when a liquid crystal gate circuit is started, a certain time of the preparation period needs to be set. The preparation period varies from 10 microseconds to 1 millisecond, and is adjusted and fixed according to the performance of the liquid crystal and the performance of the gate driver. Different applications are different.

More specifically:

In the S3, the first synchronization signal Vst1 is set as a low level voltage, the second synchronization signal Vst2 is set as a high level voltage, and Vpre is set as a low level voltage.

According to the above setting, the second transistor T2 and the third transistor T3 are both in a disconnected state.

Further, a source data signal Vdata is in a high level voltage state, and a gate data signal Vg[n] is in a high level voltage state. At this time, it enters the first-order programming state. That is, according to a basic principle of the liquid crystal, a plurality of rows of liquid crystals are successively scanned by a gate circuit Vg[n] and the storage capacitor Cs is turned on; a source data circuit of the liquid crystals is charged and operated, that is, the programming work; and then the storage capacitor Cs will obtain an appropriate electric charge state for display of a next cycle.

In the S1 and the S2, the backlight source of the liquid crystal screen is turned off; and in the S3 and the buffer stage, the backlight source of the liquid crystal screen is turned on.

In one embodiment:

In the S1 and the S2, the backlight source of the liquid crystal screen is turned off, and this period of time is called a black field; and in the S3 and the buffer stage, the backlight source of the liquid crystal screen is turned on, and this period of time is called a light field.

Figure 9:
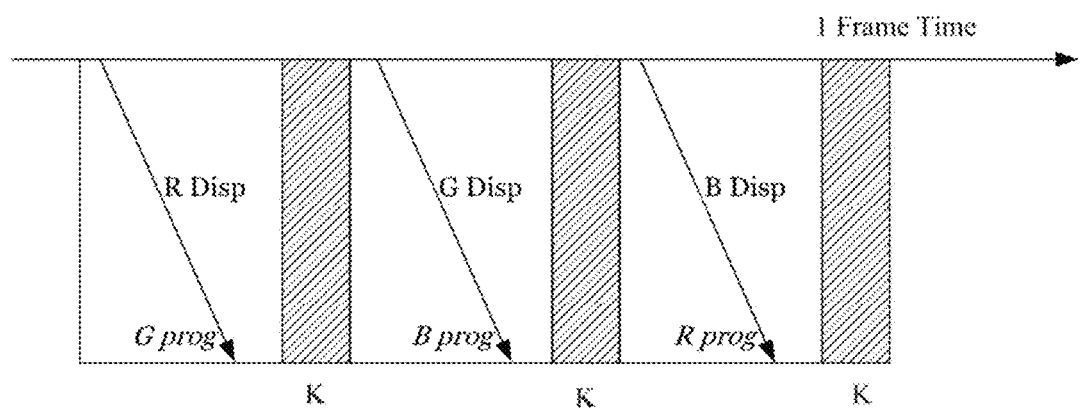
FIG. 9 is a schematic diagram of a streamlined field sequence luminescence and programming mode in a control method for liquid crystal pixels provided in embodiment 2 of the present invention.

The backlight source is turned off and the backlight source is turned on alternately to form a streamlined field-sequence drive sequence. For illustration, the present embodiment adopts a field sequence drive mode displayed by three subfields of red, green and blue (RGB) without CF film filter layer as an example:

FIG. 9 shows a streamlined field sequence luminescence and programming mode, wherein Disp represents that the backlight is turned on to display an image; Prog represents that all pixels of the liquid crystal screen are sequentially scanned to execute sequential first-order programming actions; 1 Frame Time is the display time of a frame picture containing three subfields of red, green and blue; and K is the black field, that is, the backlight source is in an off state.

For the logic of field sequence display, the three subfields are a R red subfield, a G green subfield and a B blue subfield, and the colors of the backlight source are consistent with the data of the subfields, which are also R red, G green and B blue.

Further, in a process of displaying the R red subfield, first-order programming charging data is completed. The programming data is used for the display of a next subfield, which is the green field in the schematic diagram, that is, the B subfield, by analogy.

Figure 10:
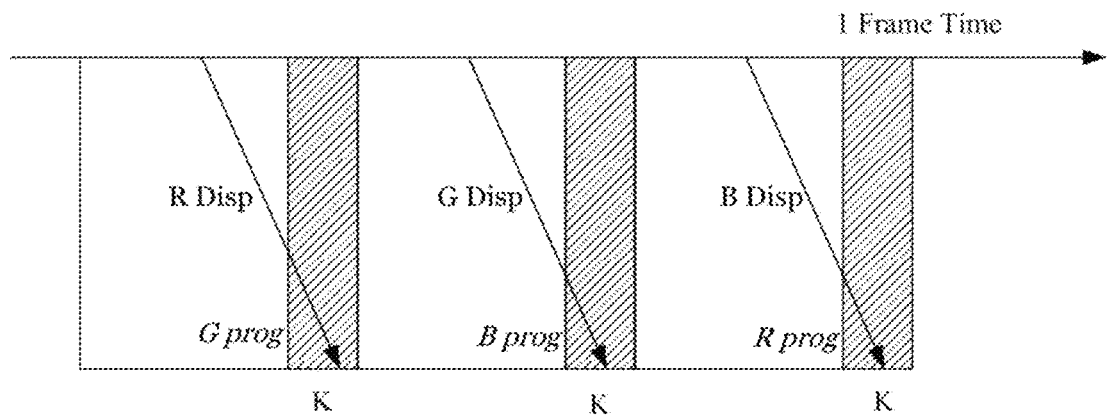
FIG. 10 is a schematic diagram of a streamlined preferred field sequence luminescence and programming mode in a control method for liquid crystal pixels provided in embodiment 2 of the present invention.

The backlight sequence of a further preferred streamlined field sequence display and liquid crystal drive can be optimized as a logic shown in FIG. 10: in the preferred mode, the first-order programming process continues to the S1 stage of the next subfield, that is, the preset charging stage, but does not extend to the S2 stage, that is, the second-order programming stage. Specific reasons are: if it takes a long time to execute the first-order programming charging behavior from the first row of scanning to the last row because the driving capability of the source data driver of the liquid crystal or the capability of the gate data driver is insufficient or because the number of scanning rows of the liquid crystal is large, then the preferred streamlined backlight drive and programming mode shown in FIG. 10 can be adopted. Under this logic, first-order programming can continue to a period of a K field, i.e., the black field.

Moreover, the first-order programming charging link of a next subframe can also be moved backward actively by adjusting the time of the buffer stage, and the first-order programming charging time continues to the link of the K-field, i.e., a black field picture. This can reduce the problem of uneven partial display caused by charge leakage due to too long time between the first-order programming charging time and an actual luminous subframe.

More specifically:

In the S1, the external level Vpre is set as a high level voltage, the first synchronization signal Vst1 is set as a low level voltage, the second synchronization signal Vst2 is set as a high level voltage, and a gate data signal Vg[n] of the first transistor T1 is set as a low level voltage.

According to the above setting, as shown in FIG. 3c, the second transistor T2 is conducted, and the first transistor T1 and the third transistor T3 are both in a disconnected state. The liquid crystal pixel capacitors Cls in all pixel arrays are synchronously pulled to the high level voltage VH to realize the charging of the preset charging module.

In this step, the VH and the Vpre of the liquid crystal pixel are controlled by the same group of circuit respectively outside the liquid crystal screen. For all the liquid crystal pixels, the preset charging voltage VH is pulled up synchronously, and the liquid crystal pixel capacitor Cls is also charged synchronously.

More specifically: in the S2, the first synchronization signal Vst1 is set as a high level voltage, the second synchronization signal Vst2 is set as a low level voltage, Vpre is set as a low level voltage, and the gate data signal Vg[n] is set as a low level voltage.

According to the above setting, the first transistor T1 and the second transistor T2 are disconnected, the third transistor T3 is conducted, and the conducted third transistor T3 discharges the liquid crystal pixel capacitor Cls.

This step has the main effect of: releasing part of the charge that is pre-charged in the liquid crystal pixel capacitor Cls in the S1 stage to finally display the voltage of the correct image. The third transistor T3 is conducted to make the capacitor data of the storage capacitor Cs and the high and low level states of Vst1 and Vst2 affect the conducting capability and the conducting time of T3, so as to appropriately release the charge for the liquid crystal pixel capacitor Cls to realize second-order programming. Thus, the voltage of the liquid crystal pixel capacitor Cls is adjusted to a voltage-charge state required for the final display, and the correct image can be displayed when the backlight drive is lighted to enter a light field sequence link.

Wherein the voltage to which the liquid crystal pixel capacitor Cls is discharged depends on the conducting capability of the third transistor T3, and the conducting capability of the third transistor T3 depends on the quantity of charge stored on the storage capacitor Cs coupled with the gate of the third transistor T3 in the previous cycle, specifically:

If the quantity of charge stored on the storage capacitor Cs coupled with the gate of the third transistor T3 is larger, the conducting capability of the third transistor T3 is stronger and the liquid crystal pixel capacitor Cls is pulled down to a lower voltage; otherwise, the voltage on the liquid crystal pixel capacitor Cls is higher.

In the S2, the voltage of the liquid crystal pixel capacitor Cls is programmed as the maintenance voltage required for display of the image by a liquid crystal screen, wherein the voltage to which the liquid crystal pixel capacitor Cls is discharged also depends on the duration of the S2, specifically:

When the duration of the S2 is longer, the liquid crystal pixel capacitance Cls is pulled down to a lower voltage; otherwise, the voltage on the liquid crystal pixel capacitor Cls is higher.

More specifically: in the first-order programming link of the S3, the entire liquid crystal screen carries out charging operation from the first row to the last row successively, a gate driver of the liquid crystal screen is mutually matched with a source driver and first-order programming charging is carried out for each liquid crystal pixel from the first row to the last row. Wherein charging data is related to a displayed image and controlled by the source driver.

The method further comprises: backlight sources of the liquid crystal screen are turned on and off successively, and a first-order programming process carried out successively in the first-order programming stage forms a streamlined driving sequential logic.

The present embodiment has at least two forms of second-order programming link, i.e., two programming manners of digital and analog, which are respectively described below in the following specific examples.

Voltage Bootstrap Digital Programming Work Sequence:

In the preset charging link of S1, the first synchronization signal Vst1 and the second synchronization signal Vst2 are both high level voltages, and the threshold voltage of the dual-gate transistor T4 is reduced after modulation and enters a conducting region, so that all pixels are synchronously set as a high level, which prepares for a subsequent pulse width modulation process.

In S31 in the first-order programming link, a programming signal Vdata is inputted to a gate node of the dual-gate transistor T4 through the transistor T1. For pixel circuits in different rows and the same column, such as pixel circuits in two rows and the same column controlled by the corresponding Vscan[1] and Vscan[2], the gates of the dual-gate transistor are programmed to Vd1 and Vd2 voltages successively, with different charge levels.

In the second-order programming link, when the second synchronization signal Vst2 is ramped up, if a rising value reaches a pre-programmed signal Vdatax, the charge on the liquid crystal pixel capacitor Cls is completely released, that is, Vpx is reduced to 0.

A specific calculation method is described as follows:

The threshold voltage of the dual-gate transistor T4 is $Vth=Vth0+k1*Vdata+k2*Vramp$;

Wherein Vth0 is an initial threshold voltage of the dual-gate transistor T4, Vdata is a source data voltage of first-order programming, and Vramp is a voltage of a ramp signal line, that is, Vst2, k1 and k2 are coefficients.

Preferably, $k1=-1$ and $k2=-1$.

If $Vramp=\beta*t$, then $Vth=Vth0-Vdata-\beta*t$, i.e., the Vth value of the dual-gate transistor T4 is in dynamic change.

For the transistor, when Vgs>Vth, the condition of starting discharge is met;

i.e.: $Vdata>Vth0-Vdata-\beta*t$;

i.e., $t=(Vth0-2*Vdata)/\beta$ is obtained through conversion.

For better illustration, an example is given below:

$Vth0=1V$, $Vdata=-2V$ and $\beta=1V/ms$, which correspond to $t=5$ ms. In specific display, when the backlight source is lit, the liquid crystal pixel is in a high level full-on state. At this moment, the duration time $t=5$ ms, and the display time of 5 ms can be achieved.

If $Vdata=-3V$, the corresponding display time changes to 7 ms.

In general, through the first-order programming stage, the first-order programming data Vdata is programmed with different data, and then different high level turn-on times can be obtained, thereby realizing digital programming results.

Wherein the Vgs is a voltage value between the source and the drain of the transistor.

The first-order programming data for each pixel is retained on a main gate continuously and does not change until a next first-order programming begins.

In a digital programming method, the first-order programming stage and a light field stage do not overlap, so the overall light field time is relatively short.

Figure 11:
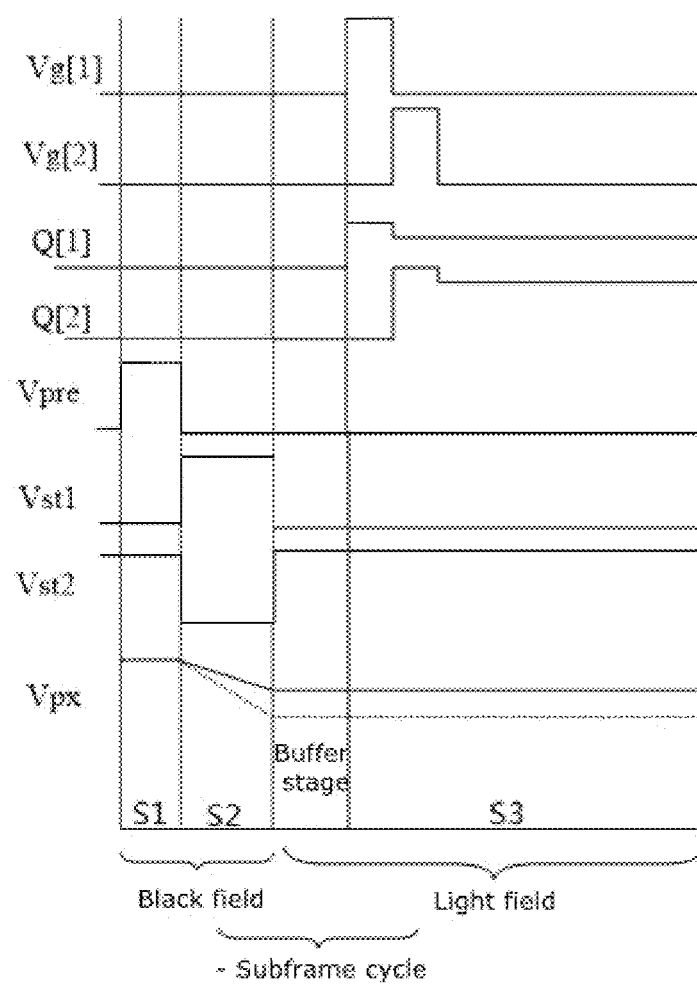
FIG. 11 is a drive sequence diagram of a liquid crystal in a control method for liquid crystal pixels provided in embodiment 2 of the present invention.
Figure 12:
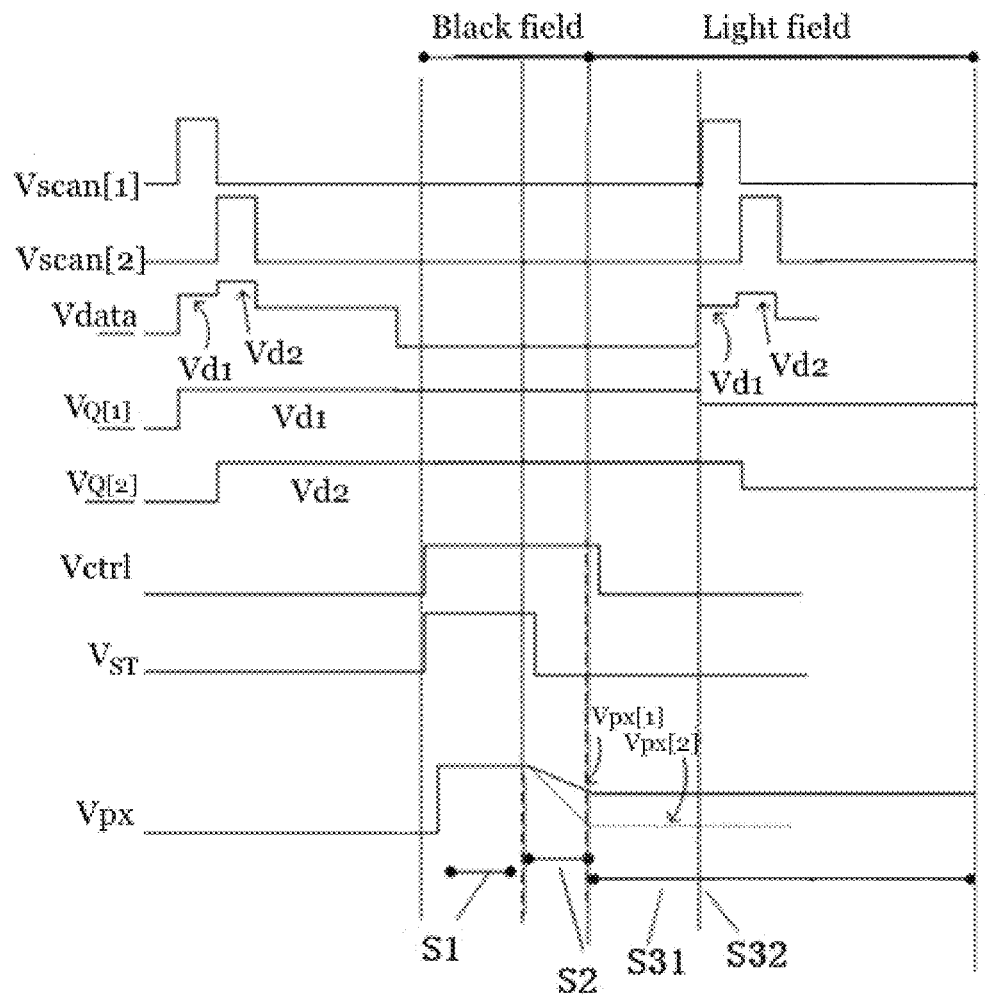
FIG. 12 is a drive sequence diagram of each drive voltage and external global voltage when Vst1 and Vst2 are square wave signals and the entire liquid crystal adopts an analog modulation method in a control method for liquid crystal pixels provided in embodiment 2 of the present invention. Wherein: 1 preset charging module, 2 second-order programming module and 3 first-order programming module.

Sequence diagrams of an analog programming method are shown in FIG. 11 and FIG. 12:

FIG. 11 shows a drive sequence realized by this method using a pixel design circuit in FIG. 3a, and FIG. 12 shows a drive sequence realized by this method using a pixel design circuit in FIG. 1.

The following embodiments describe the corresponding analog programming method under this circuit design in detail.

Specifically, FIG. 12 is a pixel circuit diagram and an operation sequence diagram of analog drive. Here, the first-order programming and the second-order programming of green G subframe, the L stage of the light field and the K stage of the black field are illustrated by taking the green G subframe behind the red R subframe as an example.

When the red R subframe is displayed, on the one hand, the red R subframe is displayed normally, and on the other hand, the first-order programming of the green G subframe is synchronously carried out. It is worth pointing out that although the data signal of the G subframe has entered the top gate of the dual-gate transistor T4 through the transistor T1, that is, the main gate, because the voltage of the bottom gate, that is, an auxiliary gate Vst2, of the dual-gate transistor T4 is low, the dual-gate transistor T4 is still in a higher threshold voltage Vth state. Therefore, the first-order programming of the green G subframe does not affect the normal display of the red R subframe, and the liquid crystal pixel capacitor Cls of the pixel circuit maintains the voltage required for the display of the red R subframe.

As shown in FIG. 12, the black field comprises two links of the preset charging link S1 and the second-order programming link S2 in FIG. 8, that is, two stages of S1 stage and S2 stage in FIG. 12. In S1, that is, the preset charging stage, first, the second synchronization signal Vst2, that is, Vctrl in the figure, becomes a high level, and the first synchronization signal Vst1, that is, Vst in the figure, is also a high level, so the operating voltage Vpx of the liquid crystal pixel capacitor Cls synchronously becomes a high level VH.

Then, S2, that is, the second-order programming stage is entered. The Vst and the Vctrl connected with the top gate and the bottom gate, that is, the main gate and the auxiliary gate, of the dual-gate transistor T4 are changed, so that the dual-gate transistor T4 is in an operating state of a lower threshold voltage Vth, that is, the conduction state begins to discharge. The discharge amount of the liquid crystal pixel capacitor Cls depends on the charge inputted to the main gate of the dual-gate transistor T4 through Vdata in first-order programming in the previous subframe. When the voltage transferred to the main gate of the dual-gate transistor T4 by Vdata is higher and the input charge is more, then the conduction capability is stronger and the discharge capability is stronger. The operating voltage Vpx of the liquid crystal pixel capacitor can be discharged and pulled down to a lower voltage; otherwise, the operating voltage Vpx is discharged to a higher voltage. The Vst and the Vctrl connected with the top gate and the bottom gate, that is, the main gate and the auxiliary gate, of the dual-gate transistor T4 are changed, and the mutual duration determines the duration of the second-order programming of the P2 stage, and also affects the operating voltage Vpx of the liquid crystal pixel capacitor. If the duration is long, the discharge time is long and the operating voltage Vpx will be pulled down to a lower voltage level; otherwise, the voltage level is relatively higher.

Finally, the light field, that is, the S3 stage is entered, i.e., the S3 link described in FIG. 8, and different backlight colors represent different colors of the light field. In the S3 stage, that is, a luminous display state in which the backlight source is lit, since Vctrl has also become a low level, the threshold voltage Vth of the dual-gate transistor T4 becomes higher and is in an off state. Then, the voltage Vpx of the liquid crystal pixel capacitor Cls maintains the operating voltage after the completion of the second-order programming.

In the above process, a working principle and a calculation method are as follows:

$$Vpx = V_H(1 - \Delta T/Tf)$$

Wherein $\Delta T$ is the discharge time, that is, the duration of P2 second-order programming; VH is a preset voltage when the liquid crystal pixel is preset to a high level; Tf is the discharge characteristic time of the liquid crystal pixel capacitor Cls, which depends on the characteristics of the liquid crystal pixel itself, and Clc is a capacitance value of the liquid crystal pixel capacitor Cls.

$$Tf = C_{LC} * Req$$

Wherein Req is the equivalent impedance of a drive transistor;

$$Req = \frac{L}{W\mu C_I(Vdata - Vt)}$$

In the above formula, L and W are channel length and channel width of the dual-gate transistor T4 respectively, is electron mobility, CI is the gate dielectric layer capacitance value per unit area of TFT, Vt is a threshold voltage Vth of TFT, and Vdata is the data voltage value inputted by the source driver at the first-order programming stage.

In conclusion, the complete expression of Vpx is:

$$Vpx = V_H\left[1 - \frac{\Delta T}{C_{LC}L}W\mu C_I(Vdata - Vt)\right]$$

Through the above way, for each liquid crystal pixel capacitor, according to the data of the image, which represents a different operating voltage Vpx of the liquid crystal pixel, the voltage aims at the same liquid crystal screen, is an invariable constant for the same data of the image and can be obtained by table look-up or through other calculation. The time of second-order programming S2 can be defined according to actual conditions. For the entire liquid crystal screen and all pixels, once an operating mode is determined, $\Delta T$ is the discharge time, that is, the duration of second-order programming S2 is also a constant. Therefore, first-order programming data Vdata that needs to be input in the first-order programming stage can be calculated through the above way, so as to realize image display and realize analog programming results.

Wherein the first-order programming data for each pixel is retained on a main gate continuously and does not change until a next first-order programming begins.

After the second-order programming stage S2, it enters the S3 stage, that is, a light field L field. In this example, the L field is a green field G Frame, and a backlight lamp is lit. After the S31 buffer stage, the first-order programming stage S32 is carried out, as shown by S31 link and S32 link in FIG. 8.

As shown in the figure, because the two pixels Vdata[1] and Vdata[2] have different data inputs, different Vpx[1] and Vpx[2] will be generated.

In addition, in the present embodiment, when the first synchronization signal Vst1 and the second synchronization signal Vst2 are square waves, the maintenance voltage $V_{maintenance}$ is in a range of $0 \leq V_{maintenance} \leq V_{full\ brightness}$, wherein $V_{full\ brightness}$ is a voltage when the liquid crystal pixel is preset to a highest level.

The present embodiment has the following beneficial effects:

(1) In the present embodiment, data programming and luminescence are parallel streamlined operations. For example, in the link of display of the red R subframe, a data programming action required for a next subframe G is also carried out synchronously. Therefore, a data writing action does not occupy the effective display time, which significantly increases the effective time, increases the time of field sequence display and reduces the requirements for the driving capability of programming devices.

When the pixel circuit design in FIG. 3a is adopted and the method in the present embodiment is adopted, the present embodiment only needs two transistors and one capacitor to realize the above functions, with controllable volume, controllable technology and controllable cost, and because of small volume, the aperture ratio and light transmittance are high and good application value is realized.

When the pixel circuit design in FIG. 1 is adopted and the method in the present embodiment is adopted, the present embodiment only needs two transistors to realize the above functions, with controllable volume, controllable technology and controllable cost, and because of small volume, the aperture ratio and light transmittance are high and good application value is realized.

Of course, the technical solution provided in the present embodiment can be used not only for the liquid crystal screen that displays by a field sequence method, but also for a conventional liquid crystal screen, that is, an ordinary liquid crystal screen in the background.

(2) In the pixel circuit design as shown in FIG. 3a, under the condition that the storage capacitor Cs is adopted, the existing main disadvantages are that number of components is large, the liquid crystal pixels spend more area for the capacitor, and the actual space for display is reduced, so the aperture ratio of the display pixels is low and the light transmission efficiency is low.

The dual-gate transistor in a preferred solution has a simpler pixel structure. This structure omits a capacitor element that consumes the most area of an original circuit, and a unit pixel only needs to use 3 TFTs. Thus, the aperture ratio of the pixel is higher, and the efficiency of photoconversion from backlight to actual display is higher.

(3) The programming work process of the original circuit depends on a charge distribution relationship of the capacitor. Because the IGZO TFT itself has a certain parasitic capacitance and especially for an ESL device, the parasitic capacitance is relatively large, an actual programming voltage value is strongly affected by the parasitic capacitance. Because the parasitic capacitances inevitably have certain deviations in process batches, the actual programming voltage value of the original pixel circuit may have deviations with the differences of the process batches.

(4) In the present embodiment, through a specific buffer design logic, for the liquid crystal screen of a different fabrication process, due to differences of a TFT process, a current leakage capacity is different. The buffer design logic better reduces conditions that part of programming data is inaccurate and the display is inaccurate due to excessive capacitor voltage drop caused by current leakage.

(5) In the present embodiment, each frame picture is preset to a high level, which eliminates a ghost phenomenon generated by the liquid crystal capacitor under a specific picture. At the same time, when the current image is displayed, the electric quantity required by display of the next frame image is programmed for charging, because programming charging at this time needs successive charging row by row and the time is very long. Through the simultaneous mode of display of the current picture and storage of electric quantity data of the next frame picture, requirements for the driving capacities of the external gate driver and the source driver are greatly reduced, the time of the picture display backlight illumination is also greatly extended and the phenomena of color confusion and screen tearing caused by insufficient brightness or overlong backlight source time due to compression of backlight source illumination time because the time from the first row to the last row is very long in a gate scanning drive mode of a liquid crystal display are effectively improved.

The above only describes preferred specific embodiments of the present invention, but the protection scope of the present invention is not limited thereto. Any change or replacement contemplated easily by those skilled in the art familiar with the technical field within the technical scope disclosed by the present invention shall be covered within the protection scope of the present invention. Therefore, the protection scope of the present invention should be determined by the protection scope of the claims.

What is claimed is:

1. A control circuit for liquid crystal pixels, characterized by comprising a preset charging module (1), a second-order programming module (2) and a first-order programming module (3) which are connected in sequence;

the preset charging module (1) is used for charging a liquid crystal pixel capacitor through a high level, and presetting a liquid crystal pixel to a high level state;

the second-order programming module (2) realizes discharge of the preset charging module (1) according to programming data of the first-order programming module (3), so that a charge of the preset charging module reaches a maintenance voltage required by display of an image by the liquid crystal pixel;

the first-order programming module (3) is configured to receive and store a charge transmitted from an external control unit for display of a next frame image:

wherein, the preset charging module (1) comprises the liquid crystal pixel capacitor Cls, one end of the liquid crystal pixel capacitor Cls is connected with a reference voltage of a liquid crystal screen, and another end is connected with the second-order programming module (2);

the second-order programming module (2) comprises a dual-gate transistor T4, one end of the liquid crystal pixel capacitor Cls is connected with the reference voltage of the liquid crystal screen, and another end is connected with a drain of the dual-gate transistor T4:

the first-order programming module (3) comprises a first transistor T1, a gate of the first transistor T1 is configured to couple to an external gate driver, and a source of the first transistor T1 is configured to couple to an external source driver;

a source of the dual-gate transistor T4 is coupled to a first synchronization signal Vst1, one gate of the dual-gate transistor T4 is coupled to a second synchronization signal Vst2, and another gate is coupled to the first transistor T1.

2. The control circuit for liquid crystal pixels according to claim 1, characterized in that when the first transistor T1 is a dual-gate transistor, one gate of the first transistor T1 is connected to Vscan and another gate is connected to the first synchronization signal Vst1, or Vscan, or one gate of the dual-gate transistor T4, or the liquid crystal pixel capacitor Cls.

3. The control circuit for liquid crystal pixels according to claim 1, characterized in that the preset charging module (1) further comprises a second transistor T2, a gate of the second transistor T2 is configured to couple to an external level Vpre, a drain is configured to couple to an external level VH, and a source is connected with the liquid crystal pixel capacitor Cls through an internal node Vpx.

4. The control circuit for liquid crystal pixels according to claim 1, characterized in that each pixel unit is at least connected with one first synchronous signal electrode wire and one second synchronous signal electrode wire; the two electrode wires are global common electrode wires used for controlling all pixels; and a layout mode of the global common electrode wires is: arranged along a transverse gate direction, arranged along a longitudinal source direction or arranged crosswise.

5. The control circuit for liquid crystal pixels according to claim 4, characterized in that adjacent two rows or two columns of the global common electrode wires of the control circuit for liquid crystal pixels can share one global common electrode wire of the same property to reduce occupation of opening area.

* * * * *